(12) United States Patent
Acar et al.

(10) Patent No.: US 6,845,669 B2
(45) Date of Patent: Jan. 25, 2005

(54) NON-RESONANT FOUR DEGREES-OF-FREEDOM MICROMACHINED GYROSCOPE

(75) Inventors: Cenk Acar, Irvine, CA (US); Andrei M. Shkel, Irvine, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/474,839

(22) PCT Filed: May 2, 2002

(86) PCT No.: PCT/US02/13702

§ 371 (c)(1),
(2), (4) Date: Mar. 26, 2004

(87) PCT Pub. No.: WO02/088631

PCT Pub. Date: Nov. 7, 2002

(65) Prior Publication Data

US 2004/0149035 A1 Aug. 5, 2004

Related U.S. Application Data

(60) Provisional application No. 60/288,117, filed on May 2, 2001.

(51) Int. Cl.[7] .......................... G01P 9/04; G01C 19/00
(52) U.S. Cl. ................... 73/504.14; 73/504.12
(58) Field of Search ..................... 73/504.02, 504.04, 73/504.12, 504.14, 504.15

(56) References Cited

U.S. PATENT DOCUMENTS 6,122,961 A * 9/2000 Geen et al. ............... 73/504.12
6,349,597 B1 * 2/2002 Folkmer et al. .......... 73/504.02
6,370,937 B2 * 4/2002 Hsu ........................... 73/1.37

* cited by examiner

Primary Examiner—Helen Kwok
(74) Attorney, Agent, or Firm—Daniel L. Dawes; Myers Dawes Andras & Sherman LLP

(57) ABSTRACT

A micromachined design and method with inherent disturbance-rejection capabilities is based on increasing the degrees-of-freedom (DOF) of the oscillatory system by the use of two independently oscillating proof masses. Utilizing dynamical amplification in the 4-degrees-of-freedom system, inherent disturbance rejection is achieved, providing reduced sensitivity to structural and thermal parameter fluctuations and damping changes over the operating time of the device. In the proposed system, the first mass is forced to oscillate in the drive direction, and the response of the second mass in the orthogonal direction is sensed. The response has two resonant peaks and a flat region between peaks. Operation is in the flat region, where the gain is insensitive to frequency fluctuations. An over 15 times increase in the bandwidth of the system is achieved due to the use of the proposed architecture. In addition, the gain in the operation region has low sensitivity to damping changes. Consequently, by utilizing the disturbance-rejection capability of the dynamical system, improved robustness is achieved, which can relax tight fabrication tolerances and packaging requirements and thus result in reducing production cost of micromachined methods.

26 Claims, 19 Drawing Sheets

NON-RESONANT FOUR DEGREES-OF-FREEDOM MICROMACHINED GYROSCOPE

RELATED APPLICATIONS

The present application is related to and claims priority under 35 USC 120 from U.S. Provisional Patent Application Ser. No. 60/288,117 filed on May 2, 2001, which is incorporated herein by reference.

BACKGROUND OF THE INVENTION

1. Field of the Invention

The invention is directed to the field of micromachined gyroscopes, and in particular to designs and methods with inherent disturbance-rejection capabilities.

2. Description of the Prior Art

With the advances in micromachining technologies, low cost, on-chip inertial micro-sensors are beginning to enter the market. Derived from the conventional integrated circuit (IC) fabrication technologies, micromachining processes allow mass-production of microstructures with moving bodies on a chip together with control and signal conditioning electronics. Thus expensive and bulky conventional inertial sensors will be eventually replaced by their micromachined counterparts without compromising performance. Likewise, micromachined gyroscopes could potentially provide high accuracy rotation measurements leading to a wide range of applications including navigation and guidance systems, automotive safety systems, and consumer electronics. Gyroscopes are probably the most challenging type of transducers ever attempted to be designed using MEMS technology. Due to complexity of their dynamics, the current state of the art micromachined gyroscopes require an order of magnitude improvement in performance, stability, and robustness.

All existing micromachined rate gyroscopes operate on the vibratory principle of a single proof mass suspended by flexures anchored to the substrate. The flexures serve as the flexible suspension between the proof mass and the substrate, making the mass free to oscillate in two orthogonal directions—the drive and the sense as shown in simplified diagram of FIGS. 3a and 3b.

The proof mass is driven into resonance in the drive direction by an external sinusoidal force with a certain drive frequency. If the gyroscope is subjected to an angular rotation, the Coriolis force is induced in the y-direction. The resulting oscillation amplitude in the sense direction is proportional to the Coriolis force, and thus to the angular velocity to be measured.

To achieve the maximum possible gain, the conventional gyroscopes are designed to operate at the peak of the response curve. This is typically achieved by matching drive and sense resonant frequencies as shown in the graph of FIG. 3c. However, the system is very sensitive to variations in system parameters causing a shift in the resonant frequency. For example, a 1% fluctuation in frequency matching between drive and sense modes will produce an error of 20% in the output signal gain. Under high quality factor conditions the gain is high, however the bandwidth is extremely narrow. In addition, the gain is affected significantly by fluctuations in damping conditions as depicted in FIG. 2b.

Fabrication imperfections are inevitable, and affect material properties and geometry of MEMS structures. For surface micromachining, the thickness of the suspension elements is determined by deposition process, and the width is affected by etching process. In addition, Young's Modulus of the structure is affected by deposition conditions. Variations in elastic modulus, beam thickness or residual stresses have drastic effects on resonant frequencies of gyroscopes. Generally, very sophisticated control electronics is used to provide operation in the region of the resonance peak. Furthermore, during the operation time of these devices, fluctuations in the ambient temperature alter the gyroscope geometry together with structural properties, and pressure fluctuations affect the damping conditions, resulting in significant errors.

To eliminate the limitations of the existing micromachined gyroscopes, what is needed is a design approach which avoids these limitations of the prior art.

BRIEF SUMMARY OF THE INVENTION

The invention contemplates a design concept for MEMS gyroscopes that shifts the complexity of the design from control architecture to system dynamics, utilizing the passive disturbance rejection capability of the 4-degrees-of-freedom (DOF) dynamical system. Specifically, a novel wide-bandwidth micromachined gyroscope design approach based on increasing the degrees-of-freedom of the oscillatory system by the use of two independently oscillating interconnected proof masses is disclosed along with preliminary experimental demonstration of implementation feasibility. With the concept of using a 4-DOF system, inherent disturbance rejection is achieved due to the wide operation frequency range of the dynamic system, providing reduced sensitivity to structural and thermal parameter fluctuations.

Thus, less demanding active control strategies are required for operation under presence of perturbations. The fabricated prototype dual-mass gyroscopes successfully demonstrated a dramatically wide driving frequency range within where the drive direction oscillation amplitude varies insignificantly without any active control, in contrast to the conventional gyroscopes where the mass has to be sustained in constant amplitude oscillation in a very narrow frequency band. Mechanical amplification of driven mass oscillation by the sensing element was also experimentally demonstrated, providing large oscillation amplitudes, which is crucial for sensor performance.

The micromachined gyroscope of the invention does not operate at resonance. Two independently vibrating proof masses comprise the dynamical system. The first mass is forced to oscillate in the drive direction, and this forced oscillation is amplified by the second mass. The response of the second mass in the orthogonal sense direction is sensed as output. The resulting 4-degrees-of-freedom dynamic system has a more favorable frequency response, and operates in a wider frequency band with insignificant changes in the gain. The device has improved robustness against expected fabrication and packaging fluctuations, especially against damping variations due to ambient pressure.

The dynamic system of the micromachined gyroscope of the invention is comprised of two vibrating proof masses suspended above the substrate by flexures extending between the active mass and the ground which are anchored to the substrate, and the flexures between active mass and the passive mass which mechanically couple the two masses. The gyroscope has two orthogonal principle axes of oscillation: the drive direction or x axis and the sense direction or y axis. Both of the proof masses are free to oscillate in the drive and sense directions. The active mass, $m_1$, is electrostatically forced in the drive direction by comb-dive, electrostatic parallel plate actuator, magnetic drive or alternative actuator structures built on each side of the mass. There is no electrostatic force applied on the passive mass, $m_2$, and the only forces acting on this mass are the spring forces and the damping forces.

The design approach is based on dynamically amplifying the oscillation of the active mass by the passive mass. The response of the passive mass in the sense direction to the rotation-induced Coriolis force is monitored by air-gap sense capacitors built around it providing the angular rate information. There exists three regions of interest on the frequency response curve, namely two resonant peaks and a flat region between the two peaks. The nominal operation of the gyroscope is in the flat region, where the signal gain is relatively high, and the sensitivity of the gain to driving frequency variations is low.

While the method has been described for the sake of grammatical fluidity as steps, it is to be expressly understood that the claims are not to be construed as limited in any way by the construction of "means" or "steps" limitations under 35 USC 112, but to be accorded the full scope of the meaning and equivalents of the definition provided by the claims. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 3A:
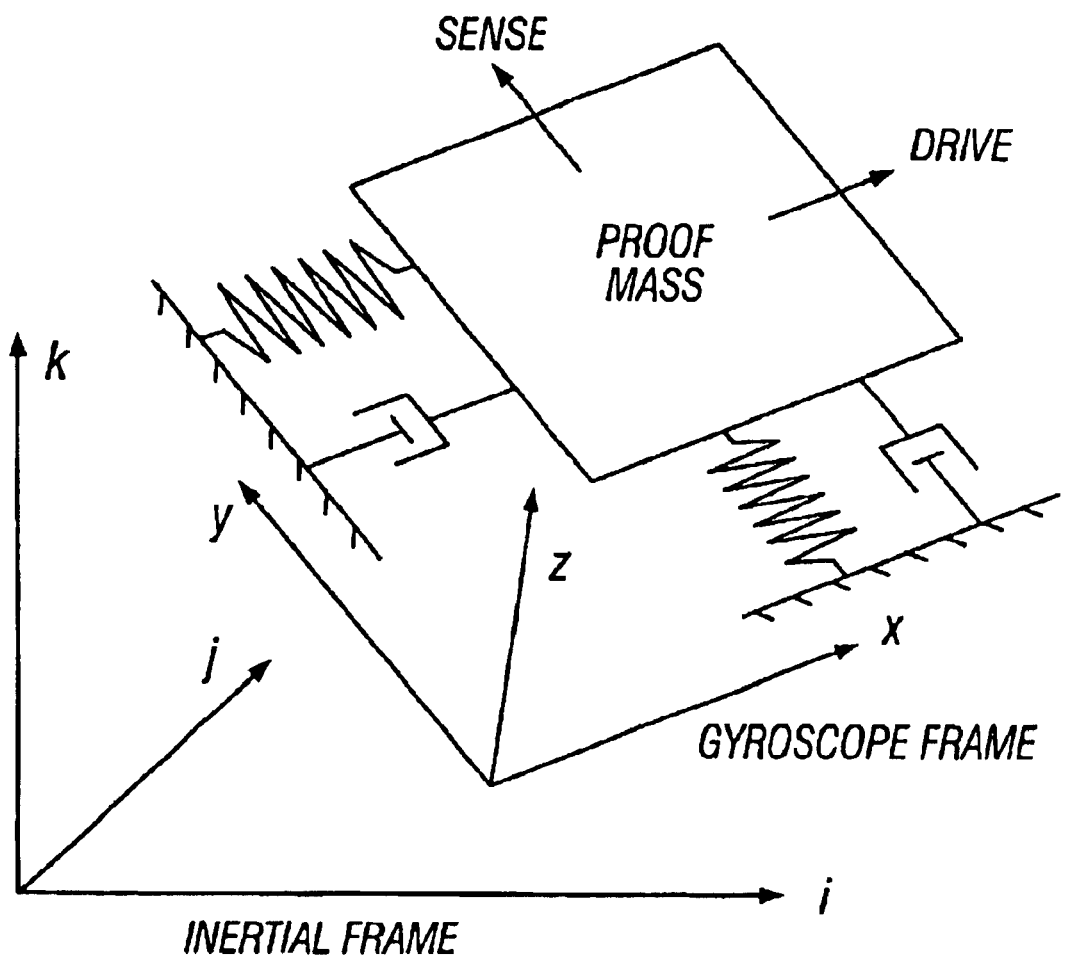
FIG. 3a is a schematic of the conventional 2-DOF gyroscope dynamical model.
Figure 3B:
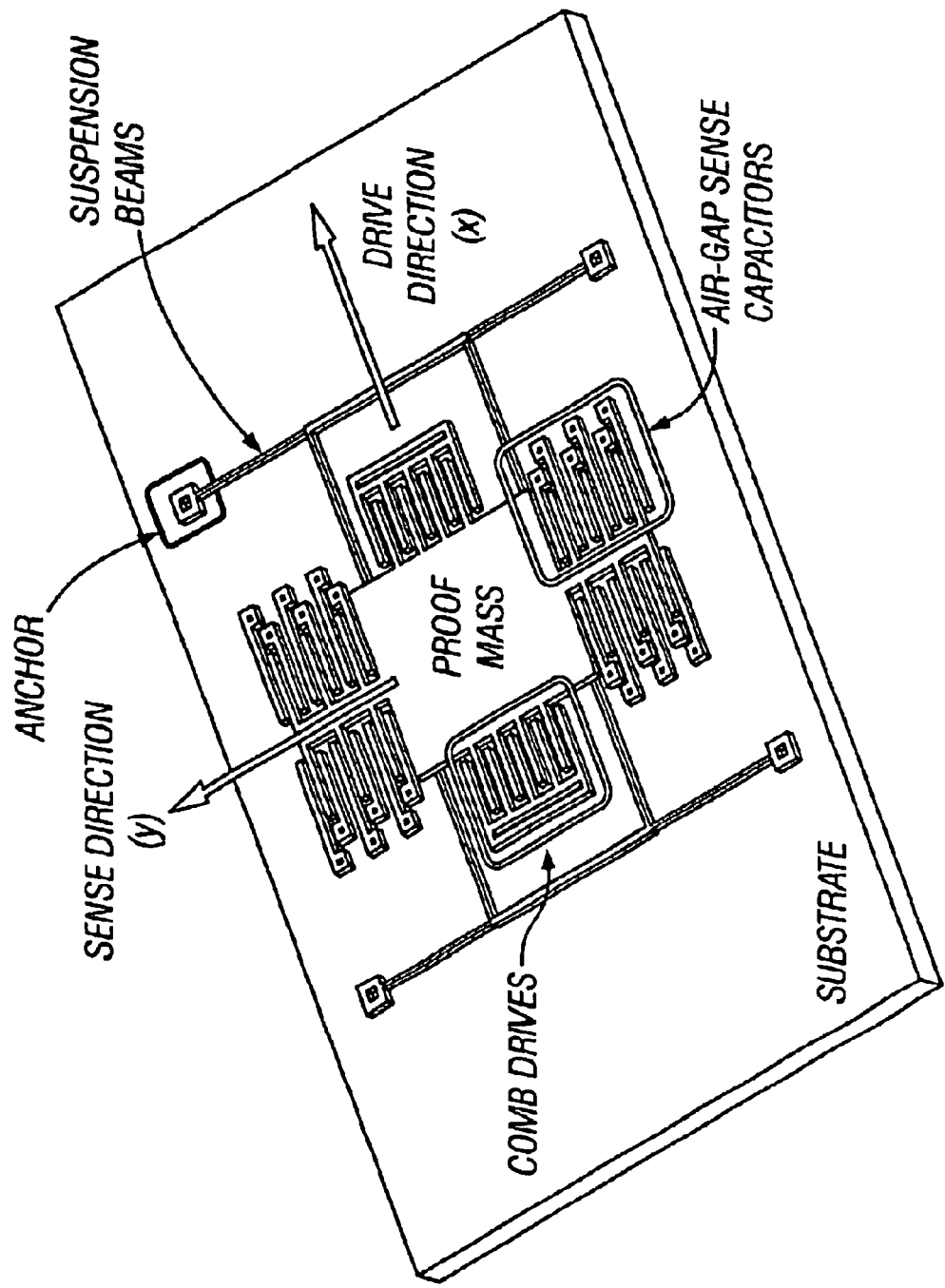
FIG. 3b is a conceptual MEMS implementation of a conventional rate gyroscope.
Figure 3C:
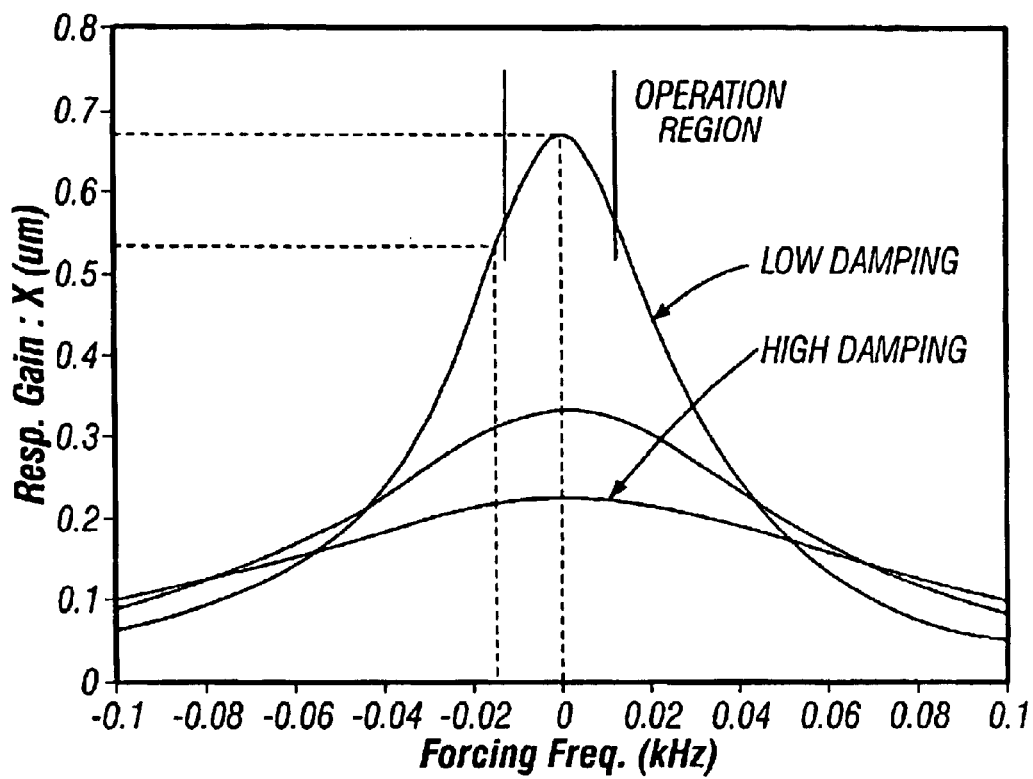
FIG. 3c is a graph of the device of FIGS. 3a and 3b in which the conventional device detects the response in the sense direction excited by the Coriolis force. The forcing frequency is plotted on the x axis and the response gain is plotted on the y axis.

The conventional micromachined rate gyroscopes operate on the vibratory principle of a 2 degrees-of-freedom (DOF)

system with a single proof mass suspended by flexures anchored to the substrate, which make the mass free to oscillate in two orthogonal directions, namely the drive and the sense directions. The proof mass is sustained in resonance in drive direction, and in the presence of an angular rotation, the Coriolis force proportional to the input angular rate is induced, exciting the proof mass in the sense direction. To achieve high gain, the drive and the sense resonant frequencies are typically designed to match, and the device is controlled to operate at the peak of their response curve. However, this resonance dependent approach results in high sensitivity to variations in system parameters. Only 1% shift in resonance frequency might produce over 20% error in the output signal gain, while major dynamical system parameters were observed to be likely to deviate by up to 15% from theoretical and numerical models in basic experiments conducted on various fabricated gyroscopes. In addition, the 2-DOF system gain is affected significantly by fluctuations in damping. Thus, sophisticated control electronics is required for constant amplitude operation in the region of the resonance peak as shown in FIGS. 3a, 3b and 3c.

Figure 1A:
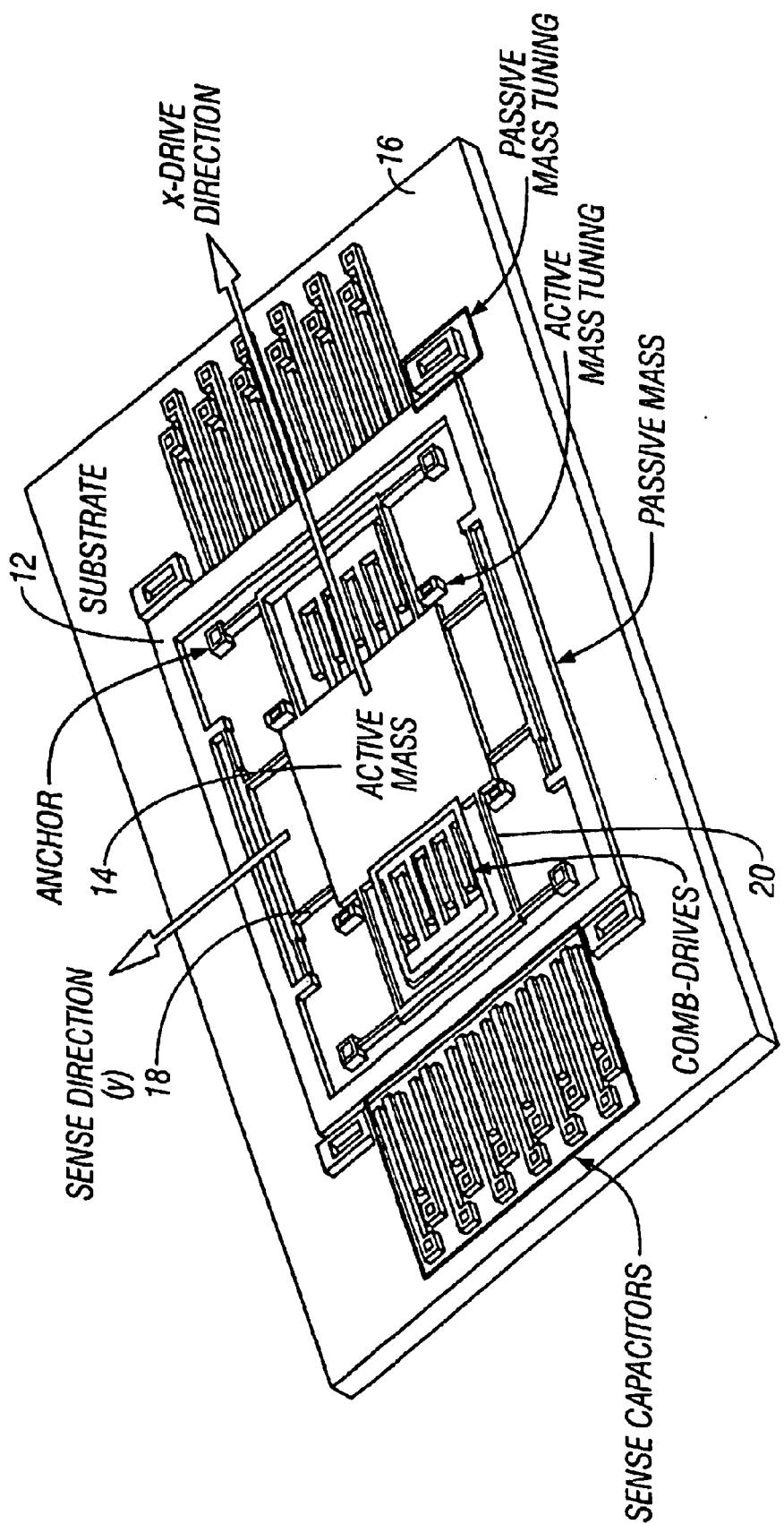
FIG. 1a is a simplified perspective view of a microgyroscope incorporating the improvements of the invention in a linear design.
Figure 1B:
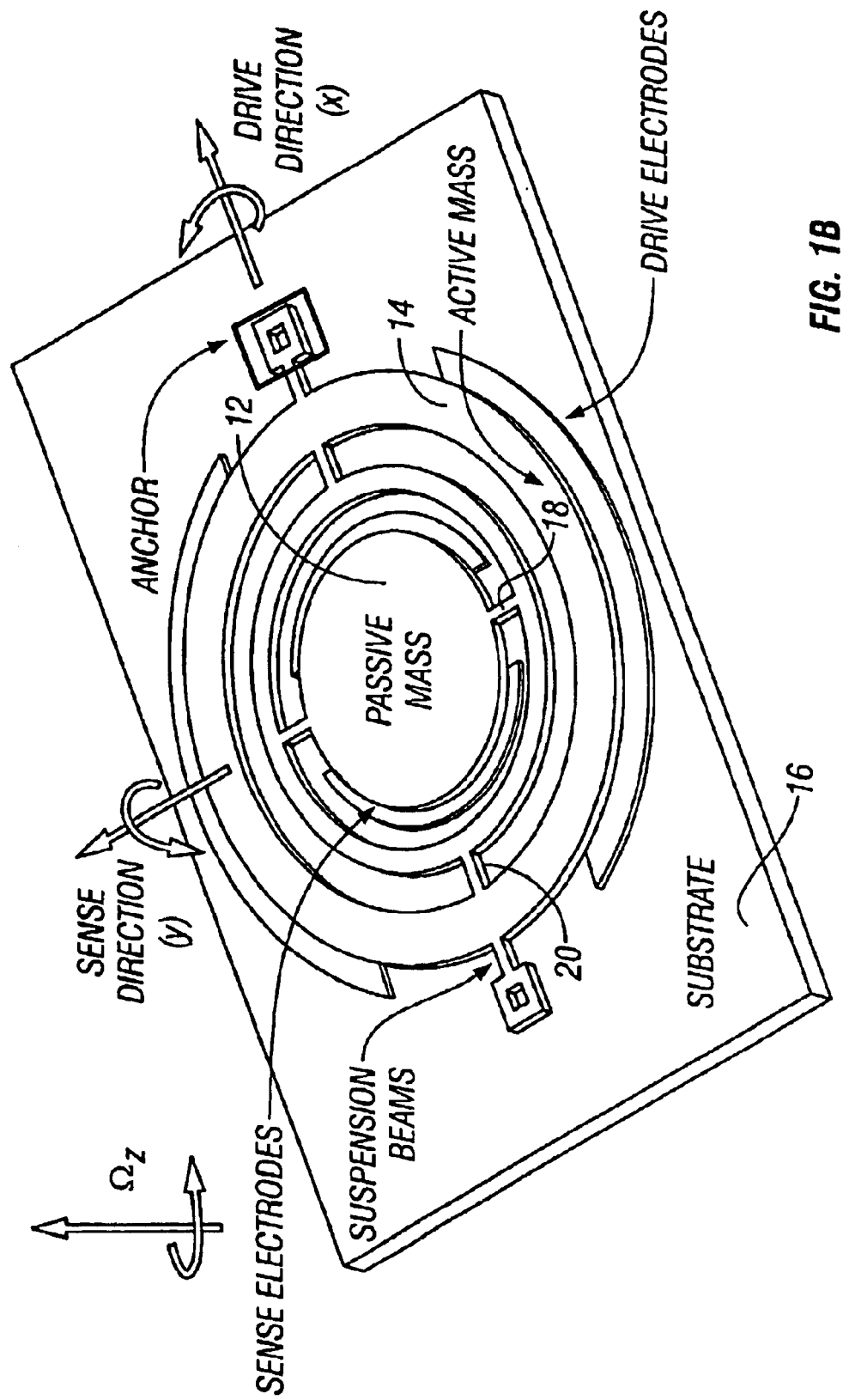
FIG. 1b is a simplified perspective view of a microgyroscope incorporating the improvements of the invention in a torsional design.
Figure 2A:
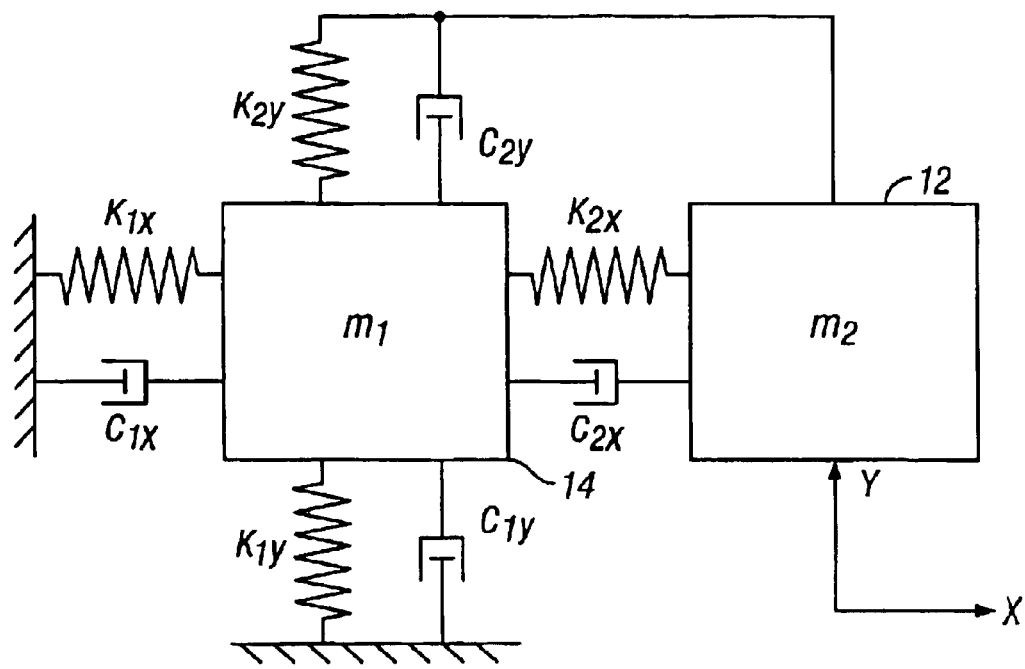
FIG. 2a is a diagrammatic depiction of a lumped parameter model of the 4-DOF gyroscope. The "passive mass" is coupled to the "active mass" in both the drive and the sense directions.

In order to overcome the drawbacks of the conventional micromachined gyroscope approach, we propose a design concept incorporating a vibratory system with increased degrees-of-freedom, providing a more favorable frequency response. In contrast to the conventional micromachined gyroscopes, the proposed design approach utilizes a "active" and a "passive" proof mass, which are free to oscillate both in the drive and sense directions (FIG. 1), forming a 4-DOF dynamic system (FIG. 2a). The active mass is forced to oscillate in the drive direction, and this forced oscillation is amplified by the passive mass, which is thus called the passive mass. The response of the passive mass to the Coriolis force in the orthogonal direction is sensed.

Figure 2B:
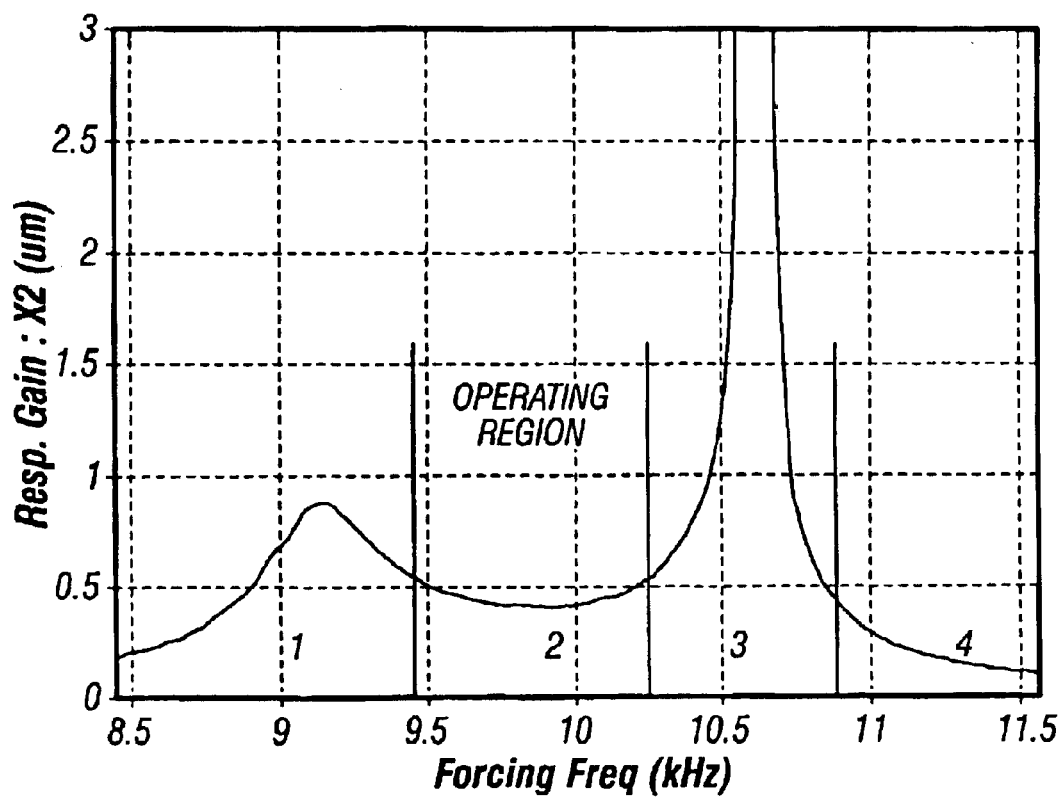
FIG. 2b is a graph of the response of the dual-mass system of FIG. 2a with the flat operating region. The forcing frequency is plotted on the x axis and the response gain is plotted on the y axis.

Due to the increased dimensionality of the dynamic system, a Coriolis response with two resonant peaks, and a flat region between peaks can be obtained (FIG. 2b). Nominal operation of the device is in the flat region of the response, where the gain is relatively insensitive to parameter fluctuations. Thus, the device can be operated in a much wider frequency band with insignificant change in the gain, providing an inherent robustness against perturbations in dynamical system parameters.

The micromachined gyroscope of the invention does not require the system to operate in resonance. The proposed architecture suggests the use of two independently vibrating proof masses in the dynamical system as shown in the perspective view of FIGS. 1a and 1b, instead of one mass, as this is typically done in the conventional devices. The first mass is forced to oscillate in the drive direction, and this forced oscillation is amplified by the second mass. The response of the second mass in the orthogonal sense direction is monitored. The resulting 4-degrees-of-freedom dynamic system has a more favorable frequency response, and can operate in a wider frequency band with insignificant change in the gain. The device is demonstrated to have improved robustness against expected fabrication and packaging fluctuations, especially against damping variations due to ambient pressure. The sensitivity of performance to realistic fabrication variations, and to temperature and pressure changes are presented in the "Parametric Sensitivity Analysis" section.

The Dual-Mass Design Approach

Figure 2C:
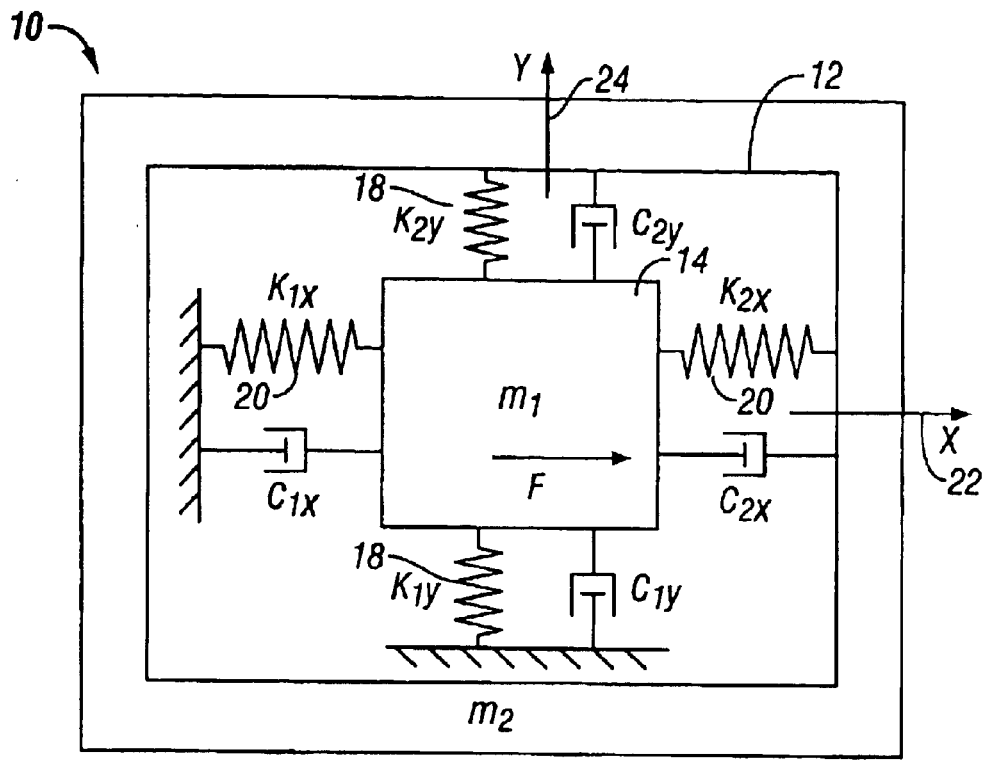
FIG. 2c is a simplified diagram of a lumped mass-spring-damper model of the dual-mass gyroscope of the invention similar to FIG. 2a, but somewhat less diagrammatic. The first mass is driven in the x direction, and the response of the second mass along the y-axis is sensed.
Figure 2D:
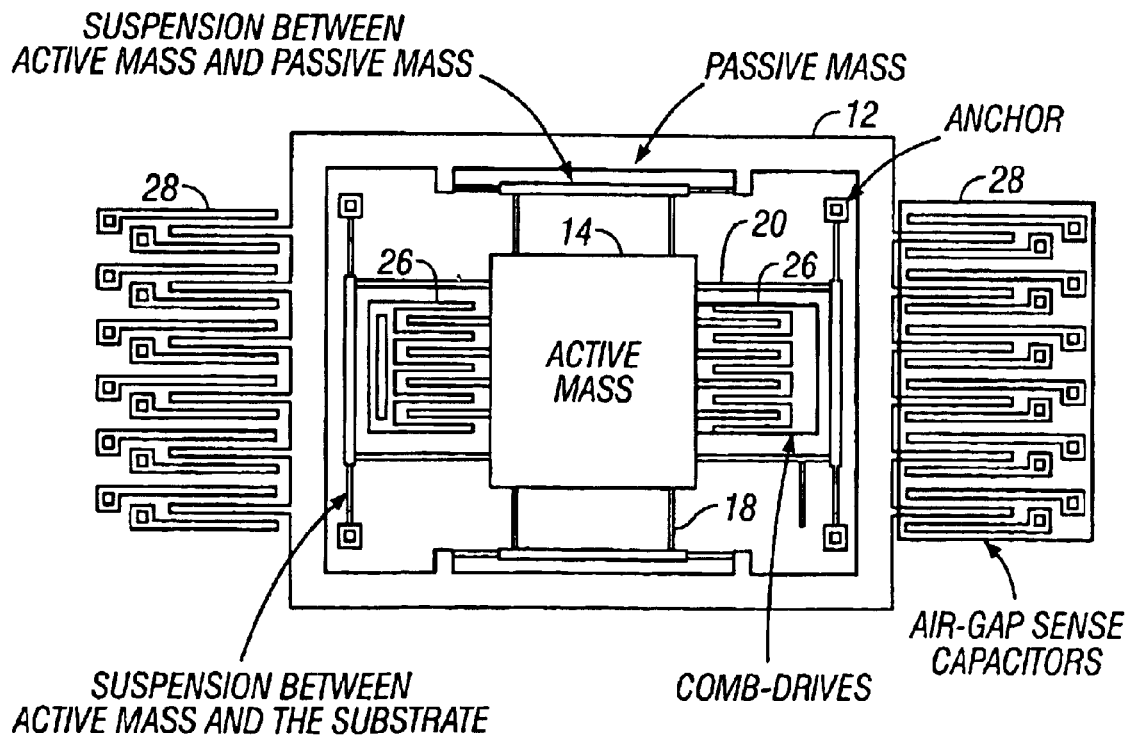
FIG. 2d is a schematic illustration of a MEMS implementation of dual-mass z-axis gyroscope in plan view of FIG. 1a in perspective view.
Figure 2E:
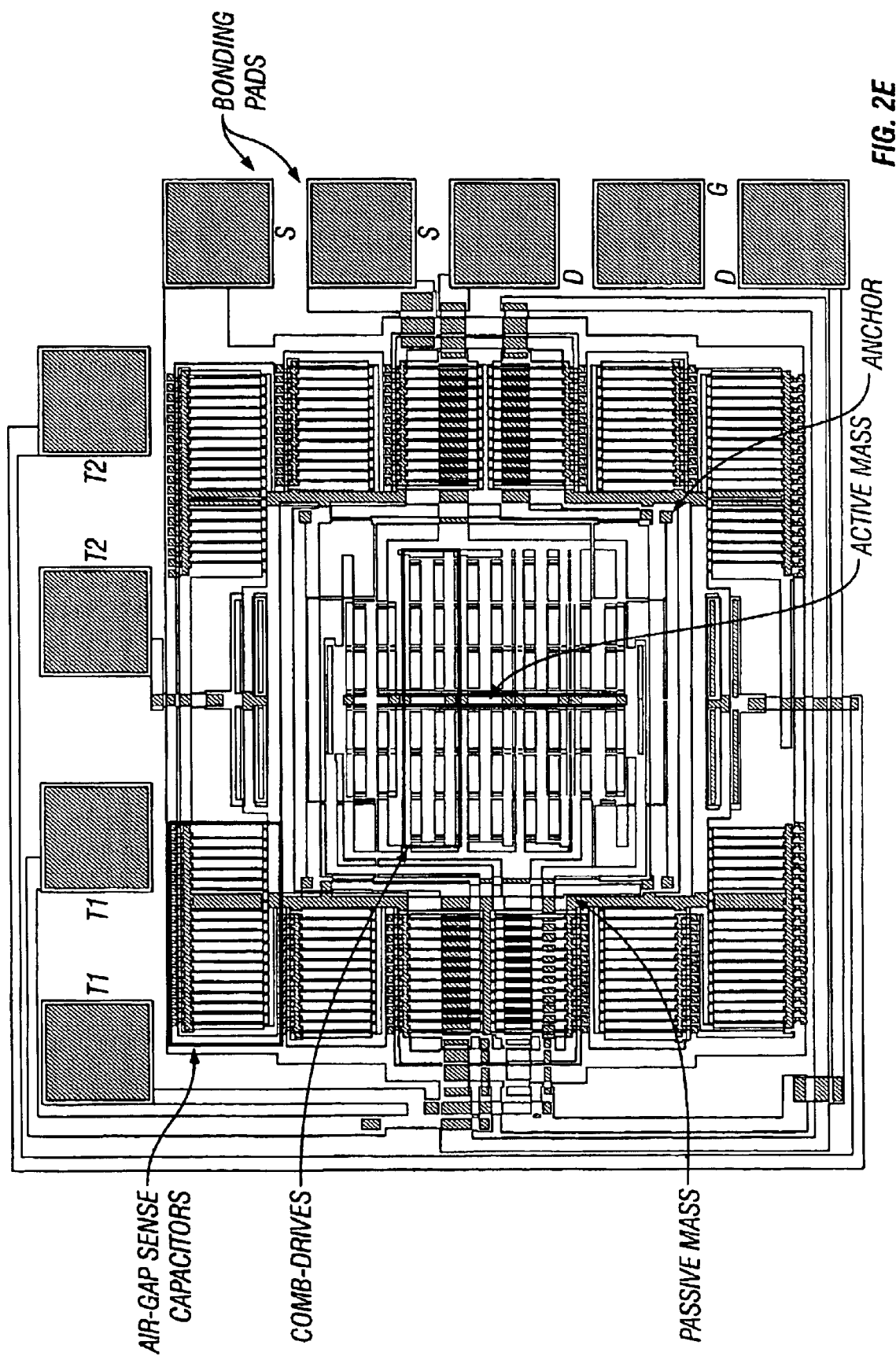
FIG. 2e is a MEMS layout of a dual-mass 4-DOF gyroscope according to the invention.

In contrast to the conventional gyroscopes that operate in resonance mode to achieve high gain, the proposed approach utilizes dynamic amplification of mechanical motion without requiring the system to operate in resonance. In order to achieve dynamic amplification, a system containing two vibrating proof masses as diagrammatically depicted in FIGS. 2a and 2c is used. Moreover, the increased design parameter space allows the response to be shaped as needed with much less compromise in performance. An implementation of the conceptual design, shown diagrammatically in FIGS. 2a and 2c, is illustrated in FIG. 2d in an a MEMS embodiment.

Drawbacks of Conventional Gyroscope Approach

Almost all reported micromachined rate gyroscopes operate on the vibratory principle of a single proof mass suspended above the substrate. The proof mass is supported by anchored flexures, which serve as the flexible suspension between the proof mass and the substrate, making the mass free to oscillate in two orthogonal directions as shown in FIGS. 3a and 3b. The drive direction, x-axis, and the sense direction, y-axis. The overall dynamical system is simply a 2-DOF mass-spring-damper system, where the drive direction is excited by the electrostatic drive forces, and the sense direction is excited by the rotation-induced Coriolis force. The equations of motion along the two principle oscillation axes, the drive direction x and the sense direction y, can be expressed as:

$$m\ddot{x}+c_x\dot{x}+(k_x-m(\Omega_y^2+\Omega_z^2))x+m(\Omega_x\Omega_y-\dot{\Omega}_z)y=F_o+2m\Omega_z\dot{y}F_c=2m\Omega_z\dot{x}$$

$$m\ddot{y}+c_y\dot{y}+(k_y-m(\Omega_y^2+\Omega_z^2))y+m(\Omega_x\Omega_y-\dot{\Omega}_z)x=-2m\Omega_z\dot{x}$$

The two final terms $2m\Omega_z\dot{y}$ and $2m\Omega_z\dot{x}$ in the equation are the rotation-induced Coriolis forces, which cause dynamic coupling between the oscillation axes, and which are used for angular rate measurement. In most of the reported micromachined vibratory rate gyroscopes, the proof mass is driven into resonance in the drive direction by an external sinusoidal force. When the gyroscope is subjected to an angular rotation, the Coriolis force is induced in the y-direction. If the drive and sense resonant frequencies are matched, the Coriolis force excites the system into resonance in the sense direction, as well. The resulting oscillation amplitude in the sense direction is proportional to the Coriolis force and, thus, to the angular velocity to be measured.

A better insight to the dynamics of the single-mass 2-DOF gyroscope can be acquired by starting with the assumption that the system is driven without feedback control in drive direction x with a constant amplitude drive force $F_d$ at the drive frequency $\omega_d$, namely $F_d=F_0 \sin \omega_d t$. For a constant angular rate input, i.e. $\dot{\Omega}_z=0$, and for angular rates much lower than the driving frequency of the gyroscope, the equations of motion reduce to:

$$m\ddot{x}+c_x\dot{x}+k_xx=F_0 \sin \omega_d t+2m\Omega_z\dot{y}$$

$$m\ddot{y}+c_y\dot{y}+k_yy=-2m\Omega_z\dot{x}$$

The 2-DOF dynamical system will have two independent resonant frequencies: drive direction resonant frequency $\omega_x$, and sense direction resonant frequency $\omega_y$. When the stiffness values in the drive and sense directions are the same, i.e. $k_x=k_y$, then the two resonance modes will be matched, i.e. $\omega_x=\omega_y$. However, fabrication imperfections are inevitable, and both the geometry and the material properties of MEMS devices are affected by etching processes, deposition conditions, and residual stresses, drastically affecting the suspension stiffness. Generally, sophisticated control electronics is used to tune the resonance frequencies for mode-matching.

The rotation-induced Coriolis force, $F_c=2m\Omega_z\dot{x}$, which is proportional to the drive direction oscillation amplitude is the only driving force in the sense direction. Denoting $x_0$ and $y_0$ as the drive and sense direction oscillation amplitudes respectively, it can be observed that the sense direction amplitude is proportional to the Coriolis force $F_c$, and thus to the drive direction oscillation amplitude. If $\omega_d = \omega_y$, then system is in resonance in the sense direction, and a high sense direction amplitude is expected due to sense direction resonance. If $\omega_d = \omega_x$, then system is in resonance in the drive direction, and a high sense direction amplitude is expected due to the increased Coriolis force $F_c$ in the drive direction resonance. Thus, when $\omega_x \approx \omega_y$, the frequency response of the 2-DOF system has two resonant peaks, one at $\omega_x$, and one at $\omega_y$. When $\omega_x = \omega_y$, the frequency response of the 2-DOF system has one combined resonant peak, which will provide a much larger response amplitude due to coinciding drive and sense resonance peaks as show in FIG. 4.

The 4-DOF System Approach

To eliminate the limitations of the conventional micromachined gyroscopes, we propose a design concept that suggests the use of an oscillatory system with increased parametric space, providing a more favorable frequency response. The proposed design concept is based on increasing the degrees-of-freedom of the oscillatory system by the use of two independently oscillating interconnected proof masses. With the 4-DOF system, inherent disturbance rejection is achieved due to the wide operation frequency range of the dynamic system, providing reduced sensitivity to structural and thermal parameter fluctuations. With the new design concept that requires less demanding active control strategies for operation under presence of perturbations, complexity of the control electronics can be shifted to dynamical system complexity. Thus, the approach is expected to provide low-cost solutions to applications with high operation condition fluctuations, where self-calibration is crucial.

In contrast to the conventional micromachined gyroscopes, the proposed design approach utilizes two vibrating proof masses suspended above the substrate, which form a 4 degrees-of-freedom (DOF) dynamic system as shown in FIG. 2a. The suspension system renders both of the proof masses free to oscillate in the drive and sense directions. The first mass is forced to oscillate in the drive direction, and this forced oscillation is amplified by the second mass. The response of the second mass to the Coriolis force in the orthogonal direction is sensed. With appropriate selection of dynamical system parameters, a Coriolis response with two resonant peaks, and a flat region between peaks can be obtained. Nominal operation of the device is in the flat region of the response, where the gain is relatively insensitive to parameter fluctuations (FIG. 2b). In this flat region, a 1% variation in natural frequencies of the system results in only 0.8% error in the output signal, which is less than 4% of the error experienced with a conventional design under similar operating conditions. Thus, the device can be operated in a much wider frequency band with insignificant change in the gain. Moreover, since the proposed device utilizes dynamic amplification of mechanical motion instead of in-resonance operation, the response is insensitive to damping changes in the operation region.

Principle of Operation

The dynamic system of the micromachined gyroscope 10 of the invention is comprised of the following main components: two vibrating proof masses 12 and 14 suspended above the substrate 16 in FIG. 1, the flexures 20 between the active mass 14 and the ground which are anchored to the substrate 16, and the flexures 18 between active mass and the passive mass which mechanically couple the masses 12 and 14 as best shown in FIG. 2d.

The gyroscope 10 has two orthogonal principle axes of oscillation: the drive direction (x axis 22 in FIG. 2c) and the sense direction (y axis 24 in FIG. 2c). Both of the proof masses 12 and 14 are rendered free to oscillate in the drive and sense directions 22 and 24 by the suspension system comprised of flexures 18 and 20.

The active mass 14, $m_1$, is electrostatically forced in the drive direction 22 by the comb-drive structures 26 built on each side of the mass 14 as best shown in FIG. 2d. There is no electrostatic force applied on the passive mass 12, m2, and the only forces acting on mass 12 are the spring forces and the damping forces. The design approach is based on dynamically amplifying the oscillation of the active mass 14 by the passive mass 12, as will be explained deeper in the "Dynamic Amplification in Drive Mode" section below. The response of the passive mass 12 in the sense direction to the rotation-induced Coriolis force is monitored by the air-gap sense capacitors 28 built around it as best shown in FIG. 2d providing the angular rate information.

Figure 4:
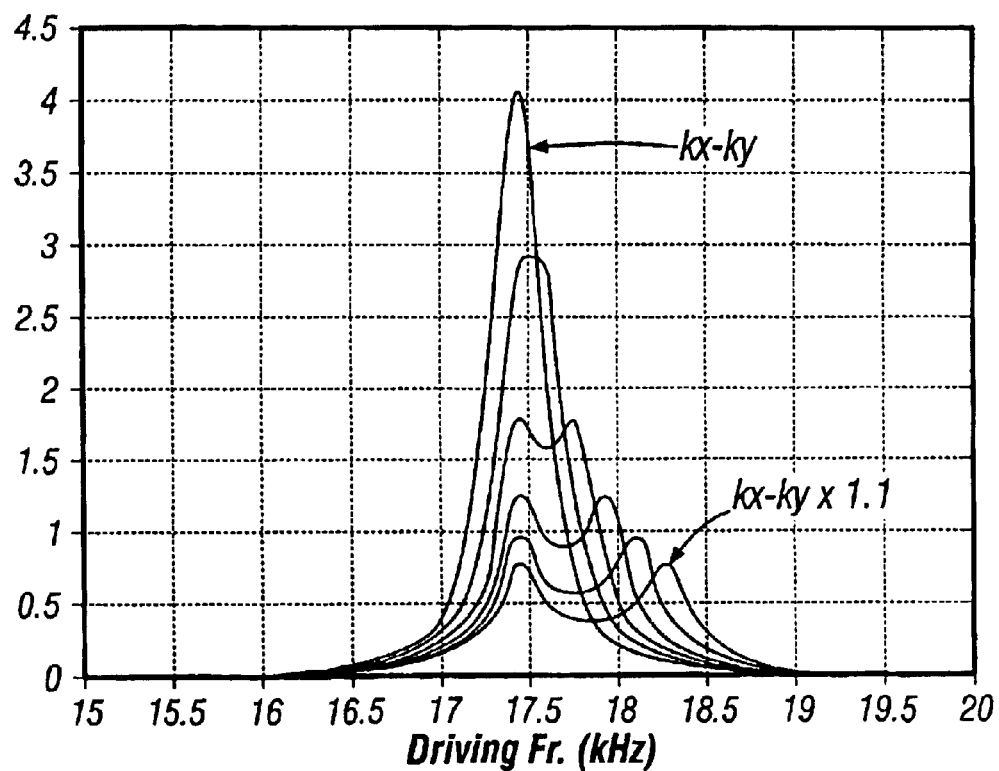
FIG. 4 is a graph which depicts the response of the overall conventional 2-DOF system with varying drive and sense stiffness mismatch showing amplitude of displacement verses driving frequency. The highest response corresponds to the case where the drive and sense modes are matched, and the response amplitude diminishes as the mismatch increases.

With appropriate selection of dynamical system parameters including. the magnitude of the masses and the spring rates, one can obtain the frequency response illustrated in FIG. 4. There exists three regions of interest on this response curve: two resonant peaks 30 and 32 in regions 1 and 3; and a flat region 34 between the peaks 30 and 32 in region 2. The nominal operation of the gyroscope 10 is in the flat region 34, where the signal gain is relatively high, and the sensitivity of the gain to driving frequency variations is low. Because of the widened bandwidth, a 1% variation in natural frequencies of the system results in only 0.8% error in the output signal, whereas the same fluctuation will produce an error of 20% in the conventional micromachined gyroscopes.

Dynamics of the Gyroscope

The dynamics of the gyroscope 10 should be considered in the non-inertial frame. The expression of absolute acceleration in the inertial frame of a rigid body with the position vector r attached to a rotating reference frame B is:

$$\vec{a}_A = \vec{a}_B + \vec{\Omega} \times (\vec{\Omega} \times \vec{r}_B) + 2\vec{\Omega} \times v_B$$

where the subscript A denotes "relative to inertial frame A", B denotes "relative to rotating gyroscope frame B", $V_B$ and $a_B$ are the velocity and acceleration vectors with respect to the reference frame respectively, $\Omega$ is the angular velocity of the gyroscope frame, and the operation "x" refers to the vector cross-product. The reference rotating gyroscope frame is assumed to be non-accelerating. The last term $2\Omega \times V_B$ in the equation, the Coriolis term, is of special interest, since the operation of the gyroscope depends on excitation of system in the sense direction by the Coriolis force due to this term. Thus for a mass driven into oscillation in x-direction, and subject to an angular rate of $\Omega_z$ about the z-axis, the Coriolis acceleration induced in the y-direction reduces to $$\vec{a}_y = 2\vec{\Omega}_z \dot{x}(t)$$

Similarly, when the active and passive masses 14 and 12 are observed in the non-inertial rotating frame, the "gyroscope frame" B, additional inertial forces appear acting on both masses 12 and 14. The equations of motion for the two-mass system can be written as:

$$m_1 \vec{a}_1 = \vec{F}_{2\text{-}1} + \vec{F}_{x\text{-}1} - 2m_1 \vec{\Omega} \times \vec{v}$$

$$_1 - m_1 \vec{\Omega} \times (\vec{\Omega} \times \vec{r}_1)) - m_1$$

$$\vec{\Omega} \times \vec{r}_1$$

$$m_2 \vec{a}_2 = \vec{F}_{2\text{-}1} + \vec{F}_{s\text{-}2} - 2m_2 \vec{\Omega} \times \vec{v}$$

$$_2 - m_2 \vec{\Omega} \times (\vec{\Omega} \times \vec{r}_2)) - m_2$$

$$\dot{\vec{\Omega}} \times \vec{r}_2$$

where $r_1$ and $r_2$ are the position vectors, $v_1$ and $v_2$ are the velocity vectors of the masses defined in the gyroscope frame, $F_{2\text{-}1}$ and $F_{1\text{-}2}$ are the opposing coupling forces between the masses that each mass applies on other depending on relative position $r_2-r_1$, including spring and damping forces. $F_{s\text{-}1}$ consists of spring and damping forces between the active mass and the substrate, and $F_{s\text{-}2}$ includes the passive mass-substrate damping force. Since both masses are subject to an angular rate of $\Omega_z$ about the axis normal to the plane of operation (z-axis), the equations of motion along the x-axis and y-axis become:

$$m_1\ddot{x}_1 + c_{1x}\dot{x}_1 + k_{1x}x_1 = k_{2x}$$

$$(x_2-x_1) + c_{2x}(\dot{x}_2-\dot{x}_1) + m_1$$

$$\Omega_z^2 x_1 - 2m_1\Omega_z\dot{y}_1 + F_d(t)$$

$$m_2\ddot{x}_2 + c_{2x}(\dot{x}_2-\dot{x}_1) + k_{2x}$$

$$(x_2-x_1) = m_2\Omega^2 x_2 - 2m_2\Omega\dot{y}_2$$

$$+ m_2 \Omega y_2$$

$$m_1\ddot{y}_1 + c_{1y}\dot{y}_1 + k_{1y}y_1 = k_{2y}(y_2-y_1) +$$

$$c_{2y}(\dot{y}_2-\dot{y}_1) + m_1\Omega^2 y_1 - 2m_1$$

$$\Omega\dot{x}_1 + m_1\Omega x_2$$

$$m_2\ddot{y}_2 + c_{2y}(\dot{y}_2-\dot{y}_1) + k_{2y}$$

$$(y_2-y_1) = m_2\Omega^2 y_2 - 2m_2\Omega\dot{x}_2 + m_2$$

$$\dot{\Omega} x_2$$

where $F_d(t)$ is the driving electrostatic force applied to the active mass 14, and $\Omega$ is the angular velocity applied to the gyroscope 10 about the z-axis.

The overall dynamic model can be reduced having the active mass 14 driven into forced oscillation in drive direction by $F_d(t)$ with a constant amplitude $x_0$ and a frequency $\omega_d$. Assuming the oscillation of the first mass 14 in the drive direction is set by the control system to be $$x_1 = x_0 \cos(\omega_d t)$$

the system (1) reduces to 3 degrees of freedom. The equations of motion of the reduced system become:

$$\ddot{y}_1 + 2\omega_n\xi\dot{y}_1 + 2\mu\omega_n\xi(\dot{y}_1-\dot{y}_2) + (\omega_n-\Omega)y_1 + \omega_n^2\sigma_1(y_1-y_2) = -2\Omega\omega_d x_0 \sin \omega_d t + \Omega x_0 \cos \omega_d t$$

$$\beta(\ddot{y}_2-\Omega^2 y_2) + 2\mu\omega_n\xi(\dot{y}_2-\dot{y}_1) - 2\beta\Omega\dot{x}_2 - \beta\dot{\omega}_z x_2 + \omega_n^2\sigma_1(y_2-y_1) = 0$$

$$\beta(\ddot{x}_2\Omega^{-2}x_2) + 2\beta\Omega\dot{y}_2 + \beta\Omega y_2 + \beta\omega_n^2\sigma_2 x_2 = \omega_n^2\sigma_2 x_0 \cos \omega_d t$$

where $$\sigma_1 = k_{2y}/k_{1y}, \sigma_2 = k_{2x}/k_{1x}, \mu = c_2/c_1, \xi = c_1/2m_1\omega_d\beta = \frac{m_2}{m_1},$$

$\sigma_1 = k_{2y}/k_{1y}$, $\sigma_2 = k_{2x}/k_{1x}$, $\mu = c_2/c_1$, $\xi = c_1/2m_1\omega_d$ is the natural frequency in the sense direction.

Implementation of the Design Concept
Suspension Design

The design concept can be realized employing any suspension system made of flexures coupling the substrate to the active proof mass allowing the active proof mass to move in both a drive and a sense direction, and coupling the passive proof mass to the active proof mass allowing the passive proof mass to move in both the drive and sense direction. For illustrative purposes only, the following suspension system is presented for application in a linear gyroscope design:

The complete suspension system is comprised of two sets of four flexible beams 36a,b, and 38a,b comprising flexures 18 and 20 for each mass 12 and 14. For each proof mass 12 and 14, one set of fixed-guided beams 38a and 38b provides the desired spring rate in the drive direction 22, while the other set 36a and 36b provides the desired spring rate in the sense direction 24. For a single fixed-guided beam, the translational stiffness in the orthogonal direction to the axis of the beam is given by $$k_y = \frac{1}{2}\frac{3EI}{\frac{L^3}{2}} = \frac{Etw^3}{L^3}$$

where E is the Young's Modulus, I is the second moment of inertia, and the beam length, thickness, and width are L, t, w, respectively.

Figure 2F:
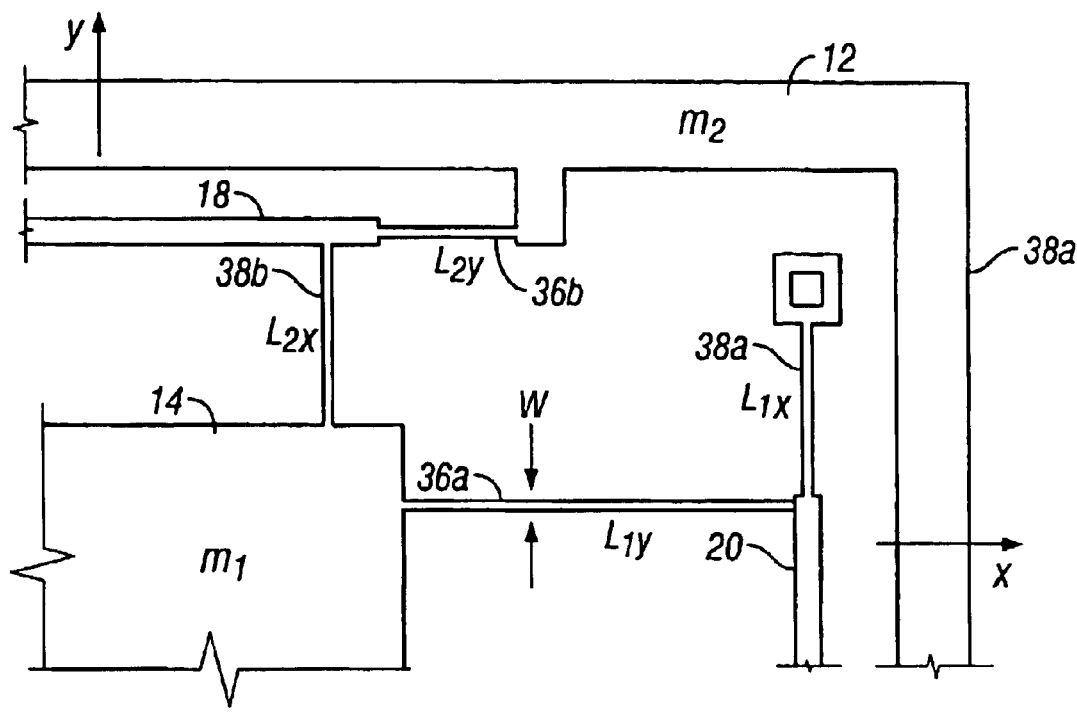
FIG. 2f is an enlarged view of a portion of the suspension system configuration of the invention which provides two degrees of freedom in the drive direction and 2 DOF in the sense directions for the active proof mass and the passive proof mass.

Spring rates for a mass in drive or sense direction are determined by four fixed-guided beams 36a,b or 38a,b if the axial strains in the other beams are neglected. Thus, each stiffness value in the dynamic system can be calculated as $$k_{1x} = \frac{4 Etw^3}{L_{1x}^3}, \quad k_{1y} = \frac{4 Etw^3}{L_{1y}^3}, \quad k_{2x} = \frac{4 Etw^3}{L_{2x}^3}, \quad k_{2y} = \frac{4 Etw^3}{L_{2y}^3}$$

where w and t are the width and thickness of the beam elements 36a,b and 38a,b in the suspension, respectively. The individual beam lengths are shown in FIG. 2f. Finite element analysis of the gyroscope 10 is performed using the software package ANSYS to validate the assumptions in the theoretical analysis. The resonant frequencies obtained from modal analysis results matched the theoretical calculations within 0.1% error. Furthermore, the operational resonant modes were observed to be well separated from the other resonant modes.

Damping Estimation

The four damping coefficients ($c_{1x}$, $c_{1y}$, $c_{2x}$, and $c_{2y}$) in the dynamical system shown in FIG. 2c are due to the viscous effects of the air between the masses and the substrate, and in between the comb-drive 26 and sense capacitor fingers 28. For the active mass 12, the total damping in the drive mode can be expressed as the sum of damping due to Couette flow between the mass 12 and the substrate 16, and the damping due to Couette flow between the integrated comb fingers 26:

$$c_{1x} = \mu_p \, p \frac{A_1}{z_0} + \mu_p \, p \frac{2 N_{comb} l_{comb} t}{y_{comb}}$$

where $A_1$ is the area of the active mass 12, $z_0$ is the elevation of the proof mass 12 from the substrate 16, t is the thickness of the structure, $N_{comb}$ is the number of comb-drive fingers, Ycomb is the distance between the fingers, $I_{comb}$ is the length of the fingers, p is the ambient pressure within the cavity of the packaged device, and $\mu_p$=3.710-4 kg/m² s Torr is the viscosity constant for air.

In the sense mode, the total damping is the sum of damping due to Couette flow between the proof mass 12 and the substrate 16, and the squeeze film damping between the integrated comb fingers:

$$c_{1y} = \mu_p \, p \frac{A_1}{z_0} + \mu_p \, p \frac{7 N_{comb} l_{comb} t^3}{y_{comb}^3}$$

However, for the passive mass 14, the total damping in the drive mode results from Couette flow between the mass 14 and the substrate 16, as well as Couette flow between the air-gap capacitor fingers 28:

$$c_{2x} = \mu_p \, p \frac{A_2}{z_0} + \mu_p \, p \frac{2 N_{capacitor} l_{finger} t}{y_{capacitor}}$$

where $A_2$ is the area of the passive mass, $N_{capacitor}$ is the number of air-gap capacitors, $y_{capacitor}$ is the distance between the capacitor fingers, and $l_{finger}$ is the length of the fingers.

Damping of the passive mass 14 in the sense mode can be estimated as the combination of Couette flow between the proof mass 14 and the substrate 16, and the squeeze film damping between the air-gap capacitor fingers 28:

$$c_{2x} = \mu_p \, p \frac{A_2}{z_0} + \mu_p \, p \frac{2 N_{comb} l_{comb} t}{y_{comb}}$$

$$c_{2y} = \mu_p \, p \frac{A_2}{z_0} + \mu_p \, p \frac{7 N_{comb} l_{comb} t^3}{y_{comb}^3}$$

These pressure dependent effective damping values will be used in the parametric sensitivity analysis simulations of the dynamic system.

Dynamic Amplification in Drive Mode

Figure 2G:
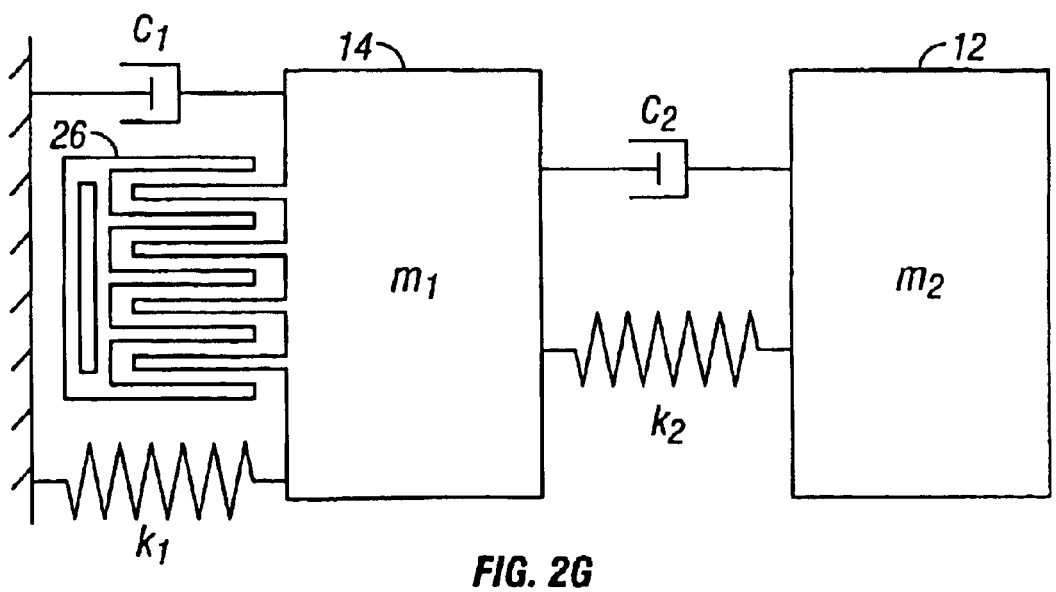
FIG. 2g is a simplified diagram of a lumped model of the drive mode of dual-mass gyroscope. The passive mass ($m_2$) acts as a vibration absorber, to amplify the motion of the active mass ($m_1$).

To achieve the maximum possible response of the gyroscope 10, amplitude of the drive-direction oscillation of the passive mass 14 should be maximized. In the drive mode, the dynamic system is simply a 2-degree-of-freedom system is modeled based on the diagram of FIG. 2g. A sinusoidal force is applied on the active mass 12 by the comb-drive structure 26. Assuming a lumped parameter model, the equations of motion in the drive mode become:

$$m_1 \ddot{x}_1 + c_{1x} \dot{x} + (k_1 + k_2) x_1 = F + k_2 x_2$$

$$m_2 \ddot{x}_2 + c_2 \dot{x}_2 + k_2 x_2 = k_2 x_1$$

where the subscript 1 denotes the active mass 14 parameters, and the subscript 2 denotes the passive mass 12 parameters. When a sinusoidal force $F = F_0 \sin(\omega t)$ is applied on the active mass by the interdigitated comb-drives 26, the steady-state response of the 2-degree-of-freedom system will be $$X_1 = \frac{F_0}{k_1} \frac{1 - \left(\frac{\omega}{\omega_2}\right)^2 + j\omega \frac{c_2}{k_2}}{\left[1 + \frac{k_2}{k_1} - \left(\frac{\omega}{\omega_2}\right)^2 + j\omega \frac{c_1}{k_1}\right]\left[1 - \left(\frac{\omega}{\omega_2}\right)^2 + j\omega \frac{c_2}{k_2}\right] - \frac{k_2}{k_1}}$$

$$X_2 = \frac{F_0}{k_1} \frac{1}{\left[1 + \frac{k_2}{k_1} - \left(\frac{\omega}{\omega_2}\right)^2 + j\omega \frac{c_1}{k_1}\right]\left[1 - \left(\frac{\omega}{\omega_2}\right)^2 + j\omega \frac{c_2}{k_2}\right] - \frac{k_2}{k_1}}$$

where $$\omega_1 = \sqrt{\frac{k_1}{m_1}} \text{ and } \omega_2 = \sqrt{\frac{k_2}{m_2}}$$

are the resonant frequencies of the isolated active and passive mass-spring mass systems, respectively. When the driving frequency $\omega_{drive}$ is matched with the resonant frequency of the isolated passive mass-spring system, i.e.

$$\omega_{drive} = \sqrt{\frac{k_2}{m_2}}$$

the passive mass 12 moves to exactly cancel out the input force F applied on the active mass 14, and maximum dynamic amplification is achieved.

The drive-direction oscillation amplitude values can be calculated knowing the magnitude of sinusoidal force $F = F_0 \sin(\omega t)$ applied on the active mass 14 by the comb-drive structure 26. Applying $V_1 = V_{DC} + v_{AC}$ to one set of comb drives 26 (e.g. the set on the right side in FIG. 2d), and $V_2 = V_{DC} - v_{AC}$ to the opposing set 26 (the set on the left side in FIG. 2d), a balanced interdigitated comb-drive scheme can be imposed. With this driving scheme, the resulting net electrostatic force is linear to VAC, which will lead to simplification of the dynamic model:

$$F = 4 \frac{\varepsilon_0 z_0 N}{y_0} V_{DC} v_{AC}$$

where $v_{AC} = |v_{AC}| \sin \omega t$ is the sinusoidal voltage, $V_{DC}$ is the constant bias voltage, $z_0$ is the finger thickness, and $y_0$ is the finger separation. Thus, for the gyroscope 10, the magnitude of the applied drive force is simply $$F = 4 \frac{\varepsilon_0 z_0 N}{y_0} V_{DC} |v_{AC}|$$

Fabrication

The design concept of wide-bandwidth micromachined z-axis gyroscope can be implemented in any standard surface or bulk micromachining process, with at least one free-standing structural layer, one sacrificial layer, and one structural layer for electrical interconnects. For illustrative purposes only, a design of z-axis gyroscope 10 for a standard two-layer 2 μm surface micromachining fabrication process is described, where polysilicon is used as the structural material, LPCVD deposited oxide (PSG) as the sacrificial layer, and silicon nitride as electrical isolation between the polysilicon and the substrate.

The proof masses, and the suspension system are formed in the second structural polysilicon layer (Poly1), together with the interdigitated comb-drives structures, which are used to drive the first mass into oscillations in the drive direction, and the air-gap capacitors which are used to sense the response of the second mass in the sense direction. The electrical connections are formed using the first structural polysilicon layer (Poly0) deposited on the nitride coating layer. The masses are suspended over the substrate with a clearance equal to the thickness of the first sacrificial layer, Oxide1.

Figure 11A:
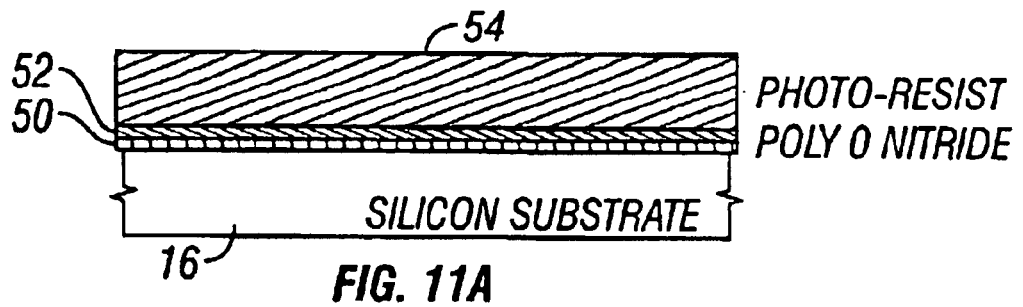
FIGS. 11a–11f if show the process steps for the initial stages of a conventional two-layer surface micromachining device.
Figure 11B:
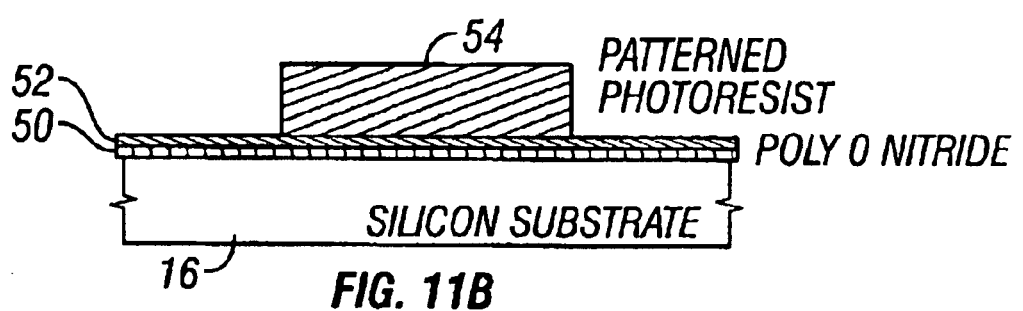
Figure 11C:
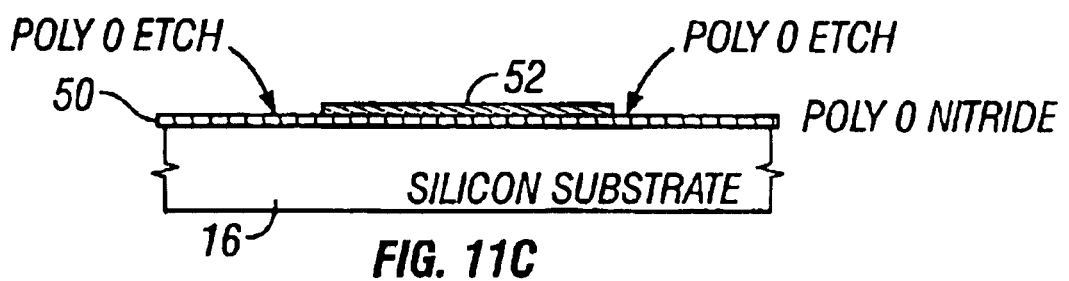
Figure 11D:
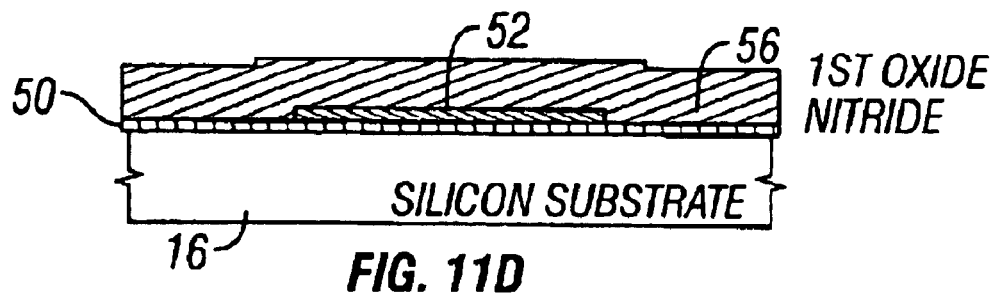
Figure 11E:
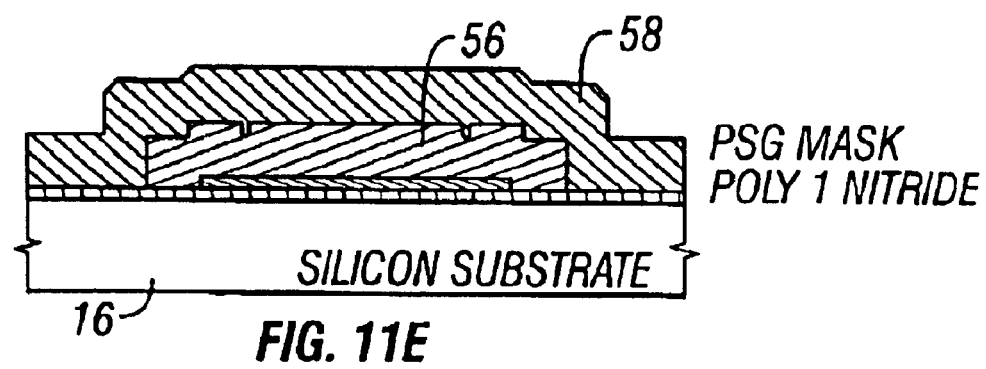
Figure 11F:
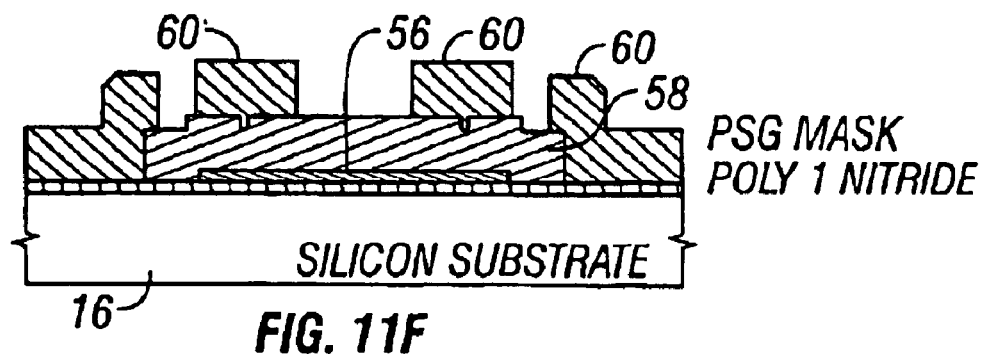

The first step of the fabrication process as illustrated in FIGS. 13a–13f is the deposition' of a thin low-stress silicon nitride layer 50 on the silicon wafer 16 as an electrical isolation layer as shown in FIG. 11a. This is followed directly by the deposition of a thin polysilicon film-Poly0 52. Poly0 52 is then patterned by photolithography, a process that includes the coating of the wafers with photoresist 54. Then photoresist 54 is exposed the with the appropriate mask and the exposed photoresist developed to create the desired etch mask for subsequent pattern transfer into the underlying layer as shown in FIG. 11b. After patterning the photoresist 54, the Poly0 layer 52 is then etched in an RIE (Reactive Ion Etch) system (Poly 0 Etch) resulting in the structure of FIG. 1c. A m phosphosilicate glass (PSG) sacrificial layer 56 is then deposited by LPCVD as shown in FIG. 11d. This layer 56 of PSG, known as the first oxide layer 56, is removed at the end of the process to free the first mechanical layer of polysilicon. The sacrificial first oxide layer 56 is lithographically patterned with the dimples mask and the dimples are transferred into the sacrificial PSG layer 56 by RIE as shown in FIG. 11e. The composite wafers are then patterned with the third mask layer 58, the anchor mask, and reactive ion etched. This step provides anchor holes 60 that will be filled by the Poly1 layer as shown in FIG. 11f. After etching anchors (not shown), which will hold the gyroscope structure above substrate 16, the first structural layer of polysilicon (Poly1) (not shown) is deposited. The polysilicon is lithographically patterned using a photoresist mask (not shown) designed to form the first structural layer POLY1 to make the device which is disclosed as described in this specification. After etching the polysilicon POLY1, the photoresist mask is stripped. Finally, the wafer is diced, and the structures such as shown in FIGS. 3a and 3b are released in HF solution.

In the presented design, the proof masses 12 and 14 and the flexures 36a,b and 38a,b are formed in Poly1 with a thickness of 2 $\mu$m. The proof mass values and the spring constants for each mass in the drive and sense directions were optimized with respect to the response gain to give a high gain, at the desired operating drive frequency, and a wide bandwidth. The masses 12 and 14 are suspended over the substrate 16 with a 2 $\mu$m clearance.

Figure 12:
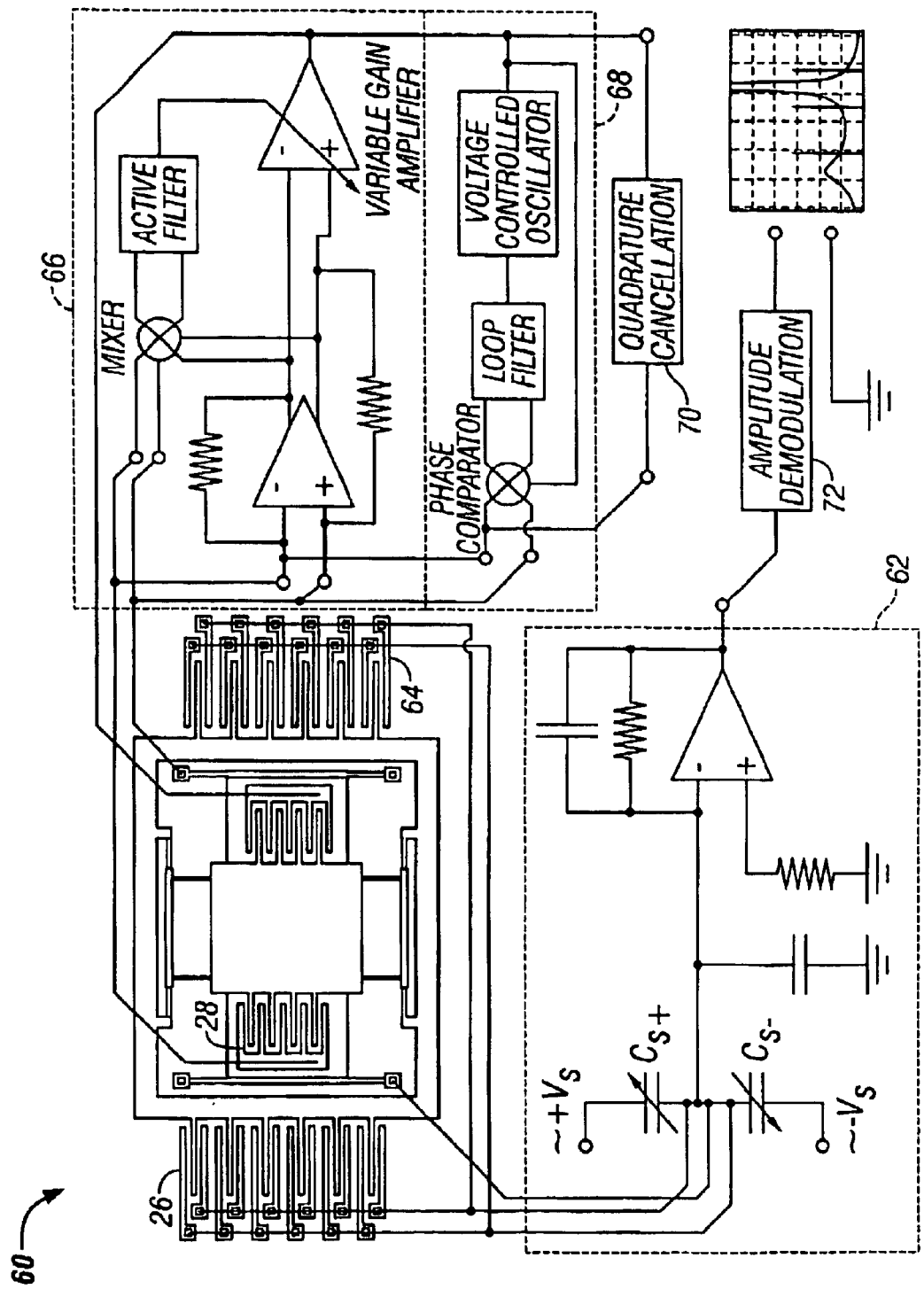
FIG. 12 is a simplified block diagram of the control system of the gyroscope including constant magnitude and frequency drive controls and sense electronics.

Interdigitated comb-drives 26 are used to drive the first mass 14 into oscillations in the drive direction. The comb-drive structures 26 are formed in Poly1. To sense the response of the second mass 12 in the sense direction, air-gap capacitors 28 are used. The capacitors 28 are also formed in Poly1. Parallel-plate capacitors are used to tune the response of the system, which are also formed in Poly1. The comb-drives 26, the air-gap capacitors 28, and the parallel-plate capacitors 64shown in FIG. 12 are connected to the bonding-pads by connection lines formed in Poly0.

Control System Issues

Since the Coriolis response of the second mass 12 in the sense direction is directly correlated with the drive oscillation amplitude, it is crucial that the second mass 12 is driven into forced oscillation in drive direction with a known constant amplitude. Thus, the primary task of the control electronics is to assure constant amplitude oscillation for the second mass 12 with the required driving frequency.

Moreover, an ideal gyroscope should be sensitive to only the input angular rate. However, in practice, micromachined gyroscopes are sensitive not only to the measured angular rate, but also to imperfections due to fabrication. Thus, the other task of the control system is to compensate for these imperfections.

Control of Oscillations in Drive Mode

The Coriolis force which drives the second mass 12 in the sense direction into forced oscillation is basically contained in the equations of motion as $F_{Coriolis} = 2m_2 \Omega \dot{x}$. Since the Coriolis force is proportional to the linear velocity of the second mass 12, it is proportional to the oscillation amplitude as well, Thus, to assure an accurate angular rate measurement, the drive mode oscillation amplitude of the second mass 12 should be kept constant by the drive electronics. This can be achieved in to basic ways: with open-loop control, and with closed-loop control.

Open-Loop Control in Drive Mode

Figure 5:
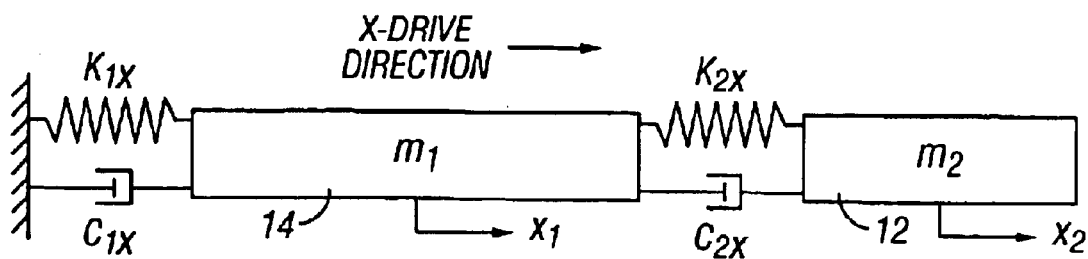
FIG. 5 is a diagrammatic depiction for a drive mode lumped mass-spring-damper model of a dual-mass gyroscope.

The gyroscope is simply a two degree-of-freedom system in the drive mode. The drive force is applied on the first mass 14 by the comb drives 26. If we assume a lumped mass-spring damper model for the system as shown in FIG. 5, the equations of motion in the drive direction can be expressed as $$m_1 \ddot{x}_1 + c_{1x} \dot{x}_1 + k_{1x} x_1 = k_{2x}(x_2 - x_1) + F_{drive}$$

$$m_2 \ddot{x}_2 + c_{2x} \dot{x} + k_{2x} x_2 = k_{2x} x_1$$

Figure 13:
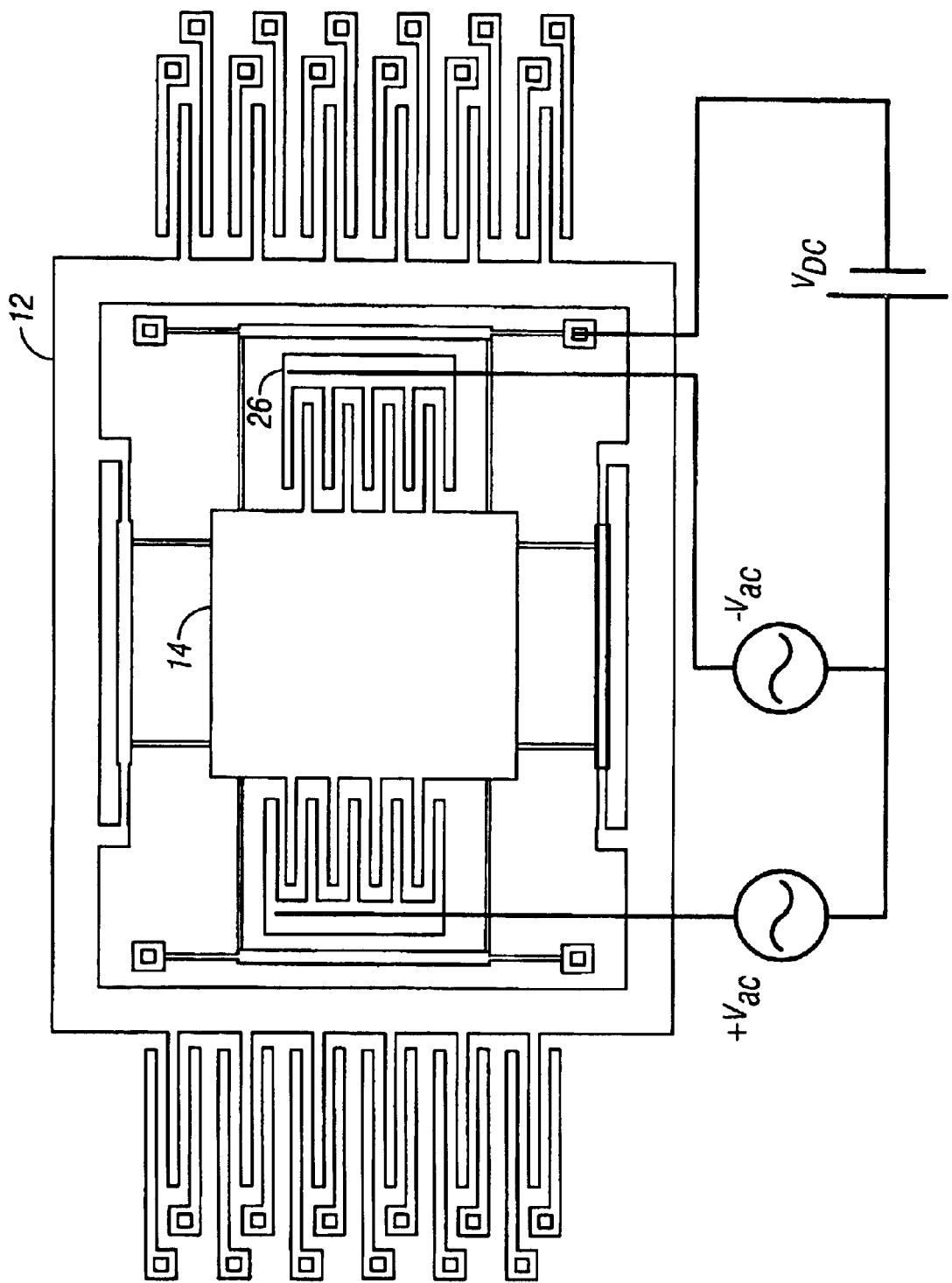
FIG. 13 is a simplified top plan view of the layout of an open-loop driving scheme for a dual-mass gyroscope.

When balanced comb-drive strategy is used as shown in FIG. 13, a net force linear to the amplitude of the alternating voltage $v_{AC} = |v_{AC}| \sin \omega t$, and the DC bias voltage VDC can be achieved. When a voltage of $V_1 = V_{DC} + v_{AC}$ is applied to one set of comb drives 26, and a voltage of $V_2 = V_{DC} - v_{AC}$ is applied to the other set, the net electrostatic force is found to be:

$$F = 4 \frac{\varepsilon_0 z_0 N}{y_0} V_{DC} v_{AC}$$

where $z_0$ is the finger thickness, and $y_0$ is the finger separation. By applying this electrostatic force profile with appropriate alternating AC voltage and DC bias voltage on the two dimensional degree-of-freedom dynamic system, the desired oscillation amplitude of the second mass is achieved.

Closed-Loop Control in Drive Mode

Since it is vital to have a known drive-direction oscillation amplitude of the second mass 12 for accurate rate measurement, any error in the oscillation amplitude is intolerable. When the gyroscope is driven in open loop, any change in system parameters will cause errors in the oscillation amplitude, leading to erroneous rate measurement. Thus it is necessary to have feedback control to achieve the desired—oscillation amplitude.

Figure 14:
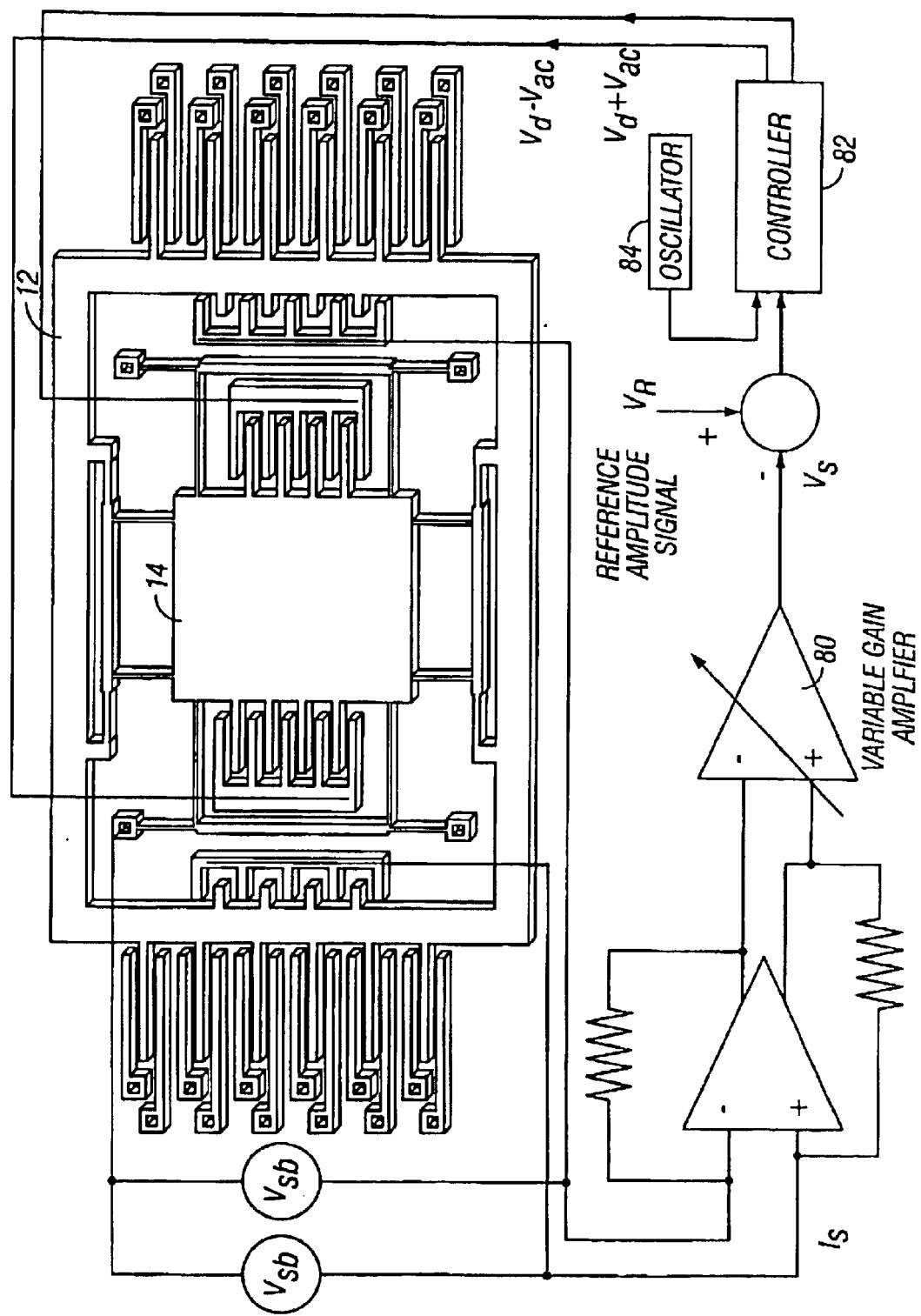
FIG. 14 is a simplified top plan view of the layout of a closed loop driving scheme for a dual-mass gyroscope.

To provide the feedback signal for the control system, comb structures 26 have to be built on the second mass 12 as shown in FIG. 14. By incorporating a trans-resistance amplifier 80 into the control loop, the displacement current generated by the oscillating second mass 12 is converted to an output voltage. This output voltage $V_s$ is then compared to a reference voltage $V_R$, which determines the desired oscillation amplitude.

The current due to capacitance change in the comb drives 26 with the motion of the second mass 12 can be expressed in terms of linear velocity, $v_2$, of second mass 12, capacitance change due to deflection, $$\frac{\partial C}{\partial x},$$

deflection sense bias voltage $V_{sb}$, and amplitude of oscillation $X_2$ as:

$$I_s = V_{sb}\frac{\partial C}{\partial x}v_2(t) = V_{sb}\frac{\partial C}{\partial x}X_2\,\omega_{drive}\,\sin(\omega_{drive}t)$$

With this current input, the output voltage from the trans-resistance amplifier 80, which will be compared to the reference input to get the error signal is:

$$V_s = V_{sb} + RV_{sb}\frac{\partial C}{\partial x}X_2\,\omega_{drive}\,\sin(\omega_{drive}t)$$

where R is the trans-resistance amplifier gain. The gain R is adjusted in conjunction with the reference voltage $V_R$. The obtained error signal e=VR−Vs is then fed into the controller 82. By summing the output voltage of the controller 82, Vrt,1 and the nominal drive voltage $V_{cont}$, the controlled total drive voltage is obtained to be fed to the comb-drives 26. A proportional controller 82 with frequency modulator drives the first mass 14 with the required voltage amplitude and frequency to converge the error signal amplitude to zero. The controller 82 receives the clock signal from an oscillator 84 which will set the driving frequency $\omega_{drive}$ to the operational frequency.

Parametric Sensitivity Analysis
Fabrication Variations

Fabrication variations can affect the parameters of gyroscopes 10 directly. For micromachining processes, the dimensions of the suspension beam elements 36a,b and 38a,b are uncertain for different reasons. The length of the beams 36a,b and 38a,b are determined solely by lithography, and are extremely accurate. However, the thickness is determined by a deposition process, and the width set by lithography is affected by etching process. Thus, these two parameters are less accurate, and can vary by 1% from wafer to wafer.

In conventional gyroscopes, fabrication variations result in resonant frequency shifts, requiring compensation by sophisticated control electronics. Yet, for the proposed system, a 0.05 μm deviation from 2 μm nominal beam width or a 0.1 μm deviation from 2 μm nominal structure thickness results in less than 1% error in the gain. Moreover, a variation in deposition conditions that affect the Young's Modulus of the gyroscopes structure by 10 GPa causes less than 0.5% error. The same parameter variations in a conventional micromachined gyroscope without compensation by control system result in over 10% error.

Pressure Fluctuations

Pressure fluctuations can have significant effects on resonance dependent conventional gyroscopes such as those shown in FIG. 2. However, since the proposed device utilizes dynamic amplification of mechanical motion, and does not operate in resonance, the response is insensitive to damping changes in the operation region. For a possible vacuum leakage from 100 milliTorrs to 500 milliTorrs, e.g. due to package sealing defects over the operation time of the device, the response gain reduces by less than 2% as shown in FIG. 7d, where the same; pressure variation can result in over 20% gain reduction in a conventional gyroscope design.

Thermal Fluctuations

Variations in the temperature of the structure can perturb the dynamical system parameters by three means: due to the inherent temperature dependence of Young's Modulus; due to changes in suspension geometry because of thermal expansion; and due to the thermally induced localized stress effects. Young's modulus of the structure at a given temperature can be calculated by:

$$E_{0°C.+\Delta T}=E_{0°C}TC_E\Delta T+E_{0°C}$$

where $E_0°$ C. is the Young's modulus for fine-grained polysilicon at 0° C. (assumed 169 GPa), TCE 1 s the temperature coefficient of Young's modulus for polysilicon (assumed −75 ppm/° C.), and $\Delta T$ is the temperature change. To reflect the effects of temperature dependent elastic modulus and thermal expansion on the resonant frequency of linear microresonators with folded-beam suspensions, the temperature coefficient of the resonance frequency can be determined as:

$$TC_f=\tfrac{1}{2}(TC_E-TC_h)$$

where $TC_E$ is the temperature coefficient of the Young's modulus, and $TC_h$ is the temperature coefficient of thermal expansion, which is assumed 2.5 ppm/° C.; leading to a perturbed resonant frequency of $$\omega_{n0°C.+\Delta T}=\omega_{n0°C}TC_f\Delta T+\omega_{n0°C.}$$

However, for the proposed suspension system, more accurate results can be found conducting finite element analysis of the system. To be able to capture parameter changes due to the temperature dependence of Young's Modulus, due to thermal expansion generated alteration in suspension geometry, and due to thermally induced stresses; a finite element model of the device was created.

First, a uniform temperature loading of 100° C. was applied to each surface, and the thermally induced localized stresses were observed. The results of the thermal finite element simulation indicated that a stress of 82 MPa was induced only in the drive-direction beam elements of active mass, effecting only $k_{1x}$. The other beam elements of the suspension system were observed to be stress-free. Then static structural analysis of the thermally loaded system with the modified Young's modulus was performed to calculate each of the four spring rates ($k_{1x}$, $k_{1y}$, $k_{2x}$, and $k_{2y}$) in the dynamical 'system shown in FIG. 2c. The same procedure was also carried out for a uniform temperature loading of 100° C. The simulation of the dynamical system with the perturbed parameters due to thermal loading indicated an deviation of less than 0.9% in the gain. Finite element analysis of a conventional gyroscope with similar geometry demonstrated about 7% gain error for the same thermal loading.

Residual Stresses

Accumulation of residual stresses in the structure directly affect the properties of the dynamical system. In the presence of residual stresses, the beam stiffness values, and thus the overall system spring rates change. Axial residual stresses in x direction effect only the y-direction spring rates ($k_{1y}$ and $k_{2y}$) of the suspension, while axial residual stresses in y direction effect only the x-direction spring rates ($k_{1x}$ and $k_{2x}$).

Thus, for the suspension system with an x-direction axial residual stress of $\epsilon_x$ and a y-direction axial residual stress of $\epsilon_y$, the deviations of the spring rates from the designed values become $$\Delta k_{1x} = \frac{EI\omega\kappa_y^2}{12L_{1x}}\left[1-\frac{2\omega}{\beta_{1x}L_{1x}}\frac{\cosh\left(\frac{\kappa_y L_{1x}}{\omega}\right)-1}{\sinh\left(\frac{\kappa_y L_{1x}}{\omega}\right)}\right]^{-1}$$

-continued $$\Delta k_{1y} = \frac{Et\omega \kappa_s^2}{12 L_{1y}} \left[ 1 - \frac{2\omega}{\beta_{1y} L_{1y}} \frac{\cosh\left(\frac{\kappa_x L_{1y}}{\omega}\right) - 1}{\sinh\left(\frac{\kappa_x L_{1y}}{\omega}\right)} \right]^{-1}$$

$$\Delta k_{2x} = \frac{Et\omega \kappa_y^2}{12 L_{2x}} \left[ 1 - \frac{2\omega}{\beta_{2x} L_{2x}} \frac{\cosh\left(\frac{\kappa_y L_{2x}}{\omega}\right) - 1}{\sinh\left(\frac{\kappa_y L_{2x}}{\omega}\right)} \right]^{-1}$$

$$\Delta k_{2y} = \frac{Et\omega \kappa_x^2}{12 L_{2y}} \left[ 1 - \frac{2\omega}{\beta_{2y} L_{2y}} \frac{\cosh\left(\frac{\kappa_x L_{2y}}{\omega}\right) - 1}{\sinh\left(\frac{\kappa_x L_{2y}}{\omega}\right)} \right]^{-1}$$

where $\kappa_y = \sqrt{12\epsilon_y}$, $\kappa_x \sqrt{12\epsilon_x}$ are the dimensionless strain factors for beam bending, and $$\beta_{1y} = \frac{L_{1y} t}{\kappa_x}, \beta_{1x} = \frac{L_{1x} \omega}{\kappa_y}, \beta_{2y} = \frac{L_{2y} t}{\kappa_x}, \text{ and } \beta_{2x} = \frac{L_{2x} \omega}{\kappa_y}.$$

However, an axial residual stress $\epsilon_x$ in the x direction effect the sense-direction spring rates ($k_{1y}$ and $k_{2y}$) of the same order, and an axial residual stress $\epsilon_y$ in the y direction effect the drive-direction spring rates ($k_{1x}$ and $k_{2x}$) of the same order as well. In result, the overall system response is less sensitive to residual stresses as shown in FIGS. 12a and 12b. To compare the sensitivity of the proposed device to the conventional approach, the designed system and a single mass gyroscope with the same geometry of the isolated active mass-spring system were simulated with a 10 MPa compression residual stress. The single-mass system experienced approximately 2.5% gain reduction, while the proposed device experienced less than 0.2% deviation in the gain.

Design Implementations

Depending on the parameters of the fabrication process, the 4-DOF design concept can be implemented in various geometries. When a fabrication technology with a high structural polysilicon thickness is used, a linear design is preferred (FIG. 1a), since large actuation forces and large sense capacitances can be achieved.with the increased thickness in the comb-drives and the air-gap capacitors.

When a surface micromachining technology with a small structural layer thickness is used, a torsional design (FIG. 1b) will be more advantageous. The active mass, which is the outermost ring, will be torsionally driven about the x-axis, and its motion will be amplified by the passive mass to obtain large torsional oscillations about the x-axis. When the device is subject to an angular rate about the axis normal to the substrate, Coriolis torques will be induced on the passive mass, driving the gimbal system into torsional oscillations about the y-axis, which will be detected by the large differential parallel-plate electrodes underneath the passive mass.

Parameter Optimization in the Drive Mode

The gyroscope is simply a 2-DOF system in the drive mode. The drive force is applied to the first mass by the comb drive structures. Approximating the gyroscope by a lumped mass-spring-damper model a shown in FIG. 5), the equations of motion in the drive direction can be expressed as:

$$m_1 \ddot{x}_1 + c_{1x} \dot{x}_1 + k_{1x} x_1 = k_{2x}(x_2 - x_1) + F_d(t)$$

$$m_2 \ddot{x}_2 + c_{2x} \dot{x}_2 + k_{2x} x_2 = k_{2x} x_1$$

Since the foremost mechanical factor determining the performance of the gyroscope is the sense direction deflection of the passive mass due to the input rotation, the parameters of the dynamical system should be optimized to maximize the oscillation amplitude of the passive mass in the sense direction. Due to mechanical amplification in the drive mode, oscillation amplitudes of the active mass is much smaller compared to the passive mass, which generates a much smaller Coriolis Force on the active mass. Thus, the dominant force that drives the system in sense direction is the Coriolis force induced on the passive mass. This requires determining an optimal $m_2$ according to Coriolis Force requirement as the first step.

Figure 6A:
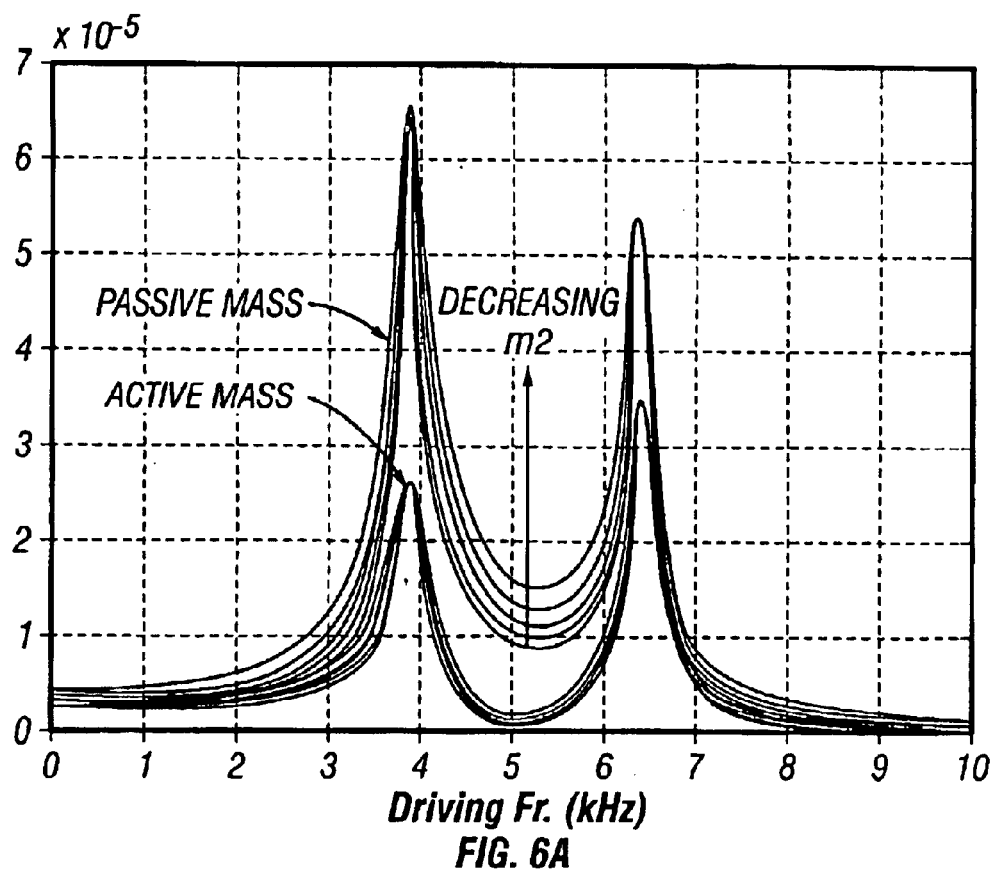
FIG. 6a is a graph of the magnitude of the passive or sense mass displacement as a function of driving frequency showing the effect of passive mass $m_2$ variation.

For a high enough Coriolis Force $2m_2\Omega_z \dot{x}_2$ acting on the passive mass, which will drive the system in sense direction, $m_2$ has to be large. However, if the response of the passive mass in the drive direction is observed for varying $m_2$ values, it is seen that for high oscillation amplitudes of passive mass, $m_2$ has to be as small as possible (FIG. 6a). Thus, an optimal passive mass is selected based on these criteria.

Figure 6B:
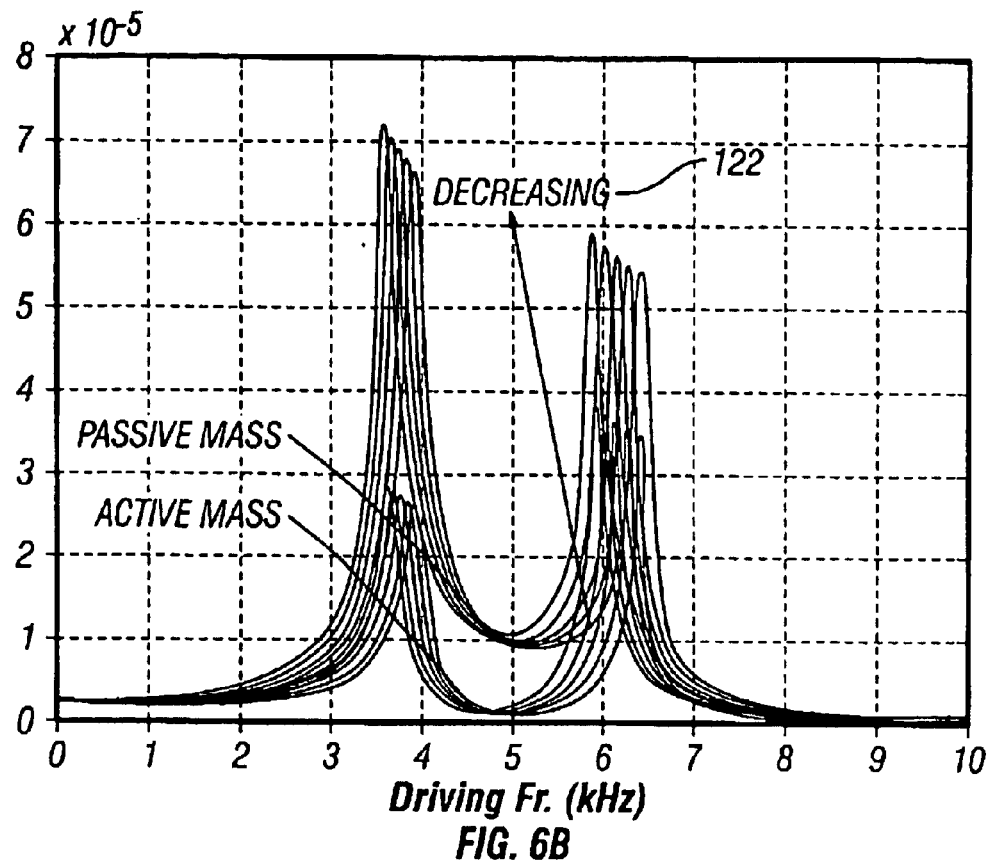
FIG. 6b is a graph of the magnitude of the passive or sense mass displacement as a function of driving frequency showing the effect of antiresonant frequency $\omega_{22}$ variation on drive direction response.

As the second step, the resonant frequency $\omega_{22}$ of the isolated passive mass-spring system is determined according to gyroscope operating frequency specifications. It should be noticed that larger Coriolis forces are induced at higher frequencies, but the oscillation amplitudes become larger at lower frequencies (FIG. 6b). Once $\omega_{22}$ is fixed, the drive direction spring constant $k_{2x}$ of the passive mass is obtained from $\omega_{22}$ and $m_2$.

Figure 7A:
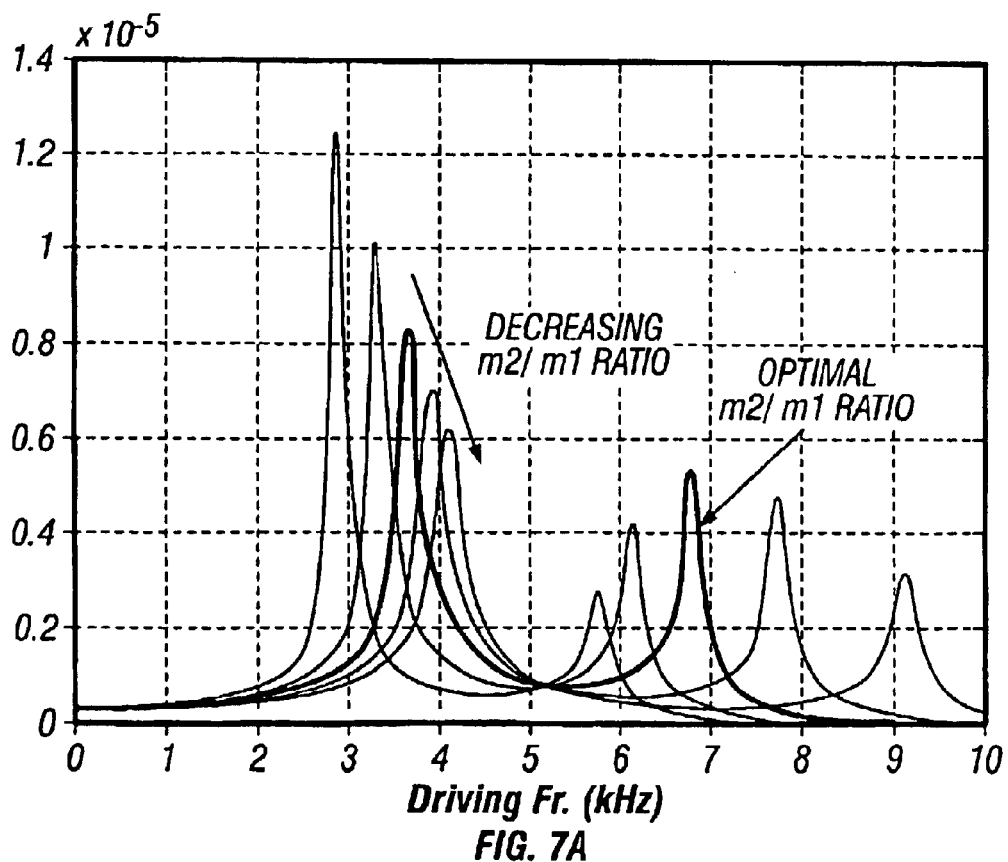
FIG. 7a is a graph of the magnitude of the passive or sense mass displacement as a function of driving frequency showing the effect of a mass ratio $\mu=m_2/m_1$ variation.

To determine the mass of the active mass, an optimal mass ratio $\mu = m_2/m_1$ has to be found. In order to achieve insensitivity to damping, the resonance peaks of the 2-DOF system response have to be separated enough, which imposes a minimum value for $\mu$. For a wide bandwidth, again a large $\mu$ is required for enough separation of the peaks; however, to prevent gain drop, the peak separation should be narrow enough (FIG. 7a).

The degree of mechanical amplification depends on the ratio of the isolated active and passive mass-spring systems, namely $$\omega_{11} = \sqrt{\frac{k_{1x}}{m_1}} \text{ and } \omega_{22} = \sqrt{\frac{k_{2x}}{m_2}}.$$

Figure 7B:
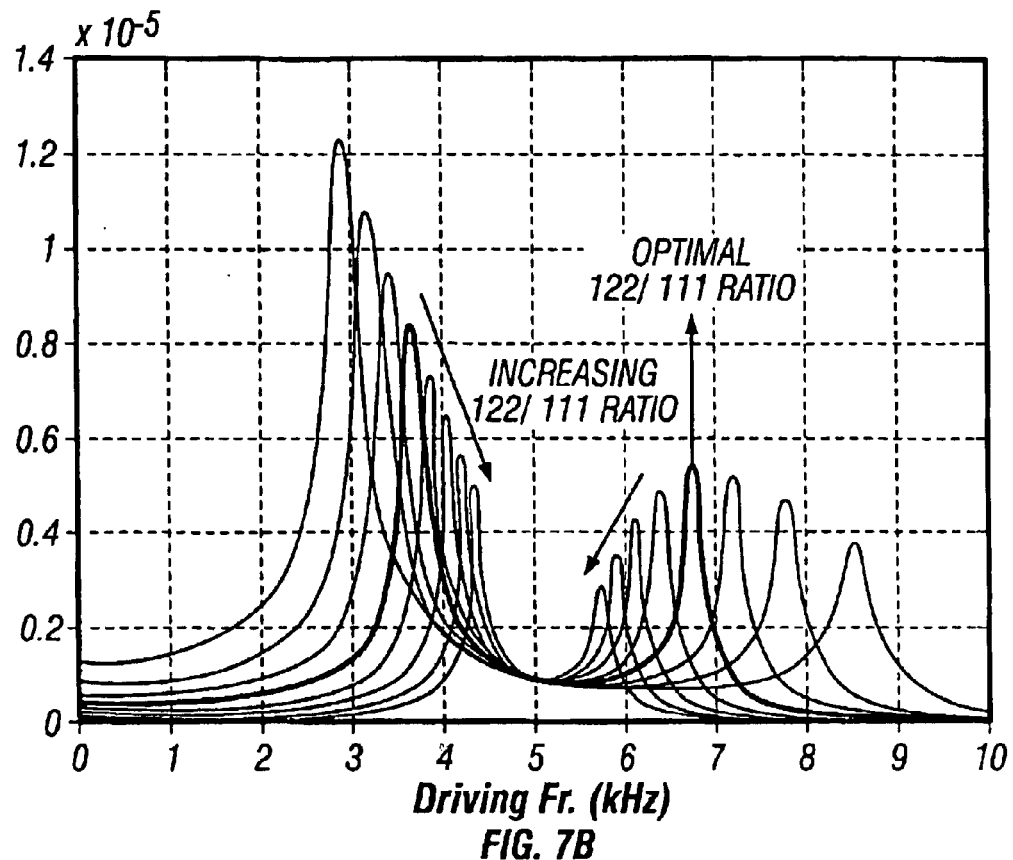
FIG. 7b is a graph of the magnitude of the passive or sense mass displacement as a function of driving frequency showing the effect of the frequency ratio $y=\omega_{22}/\omega_{11}$ variation on drive direction response.
Figure 8:
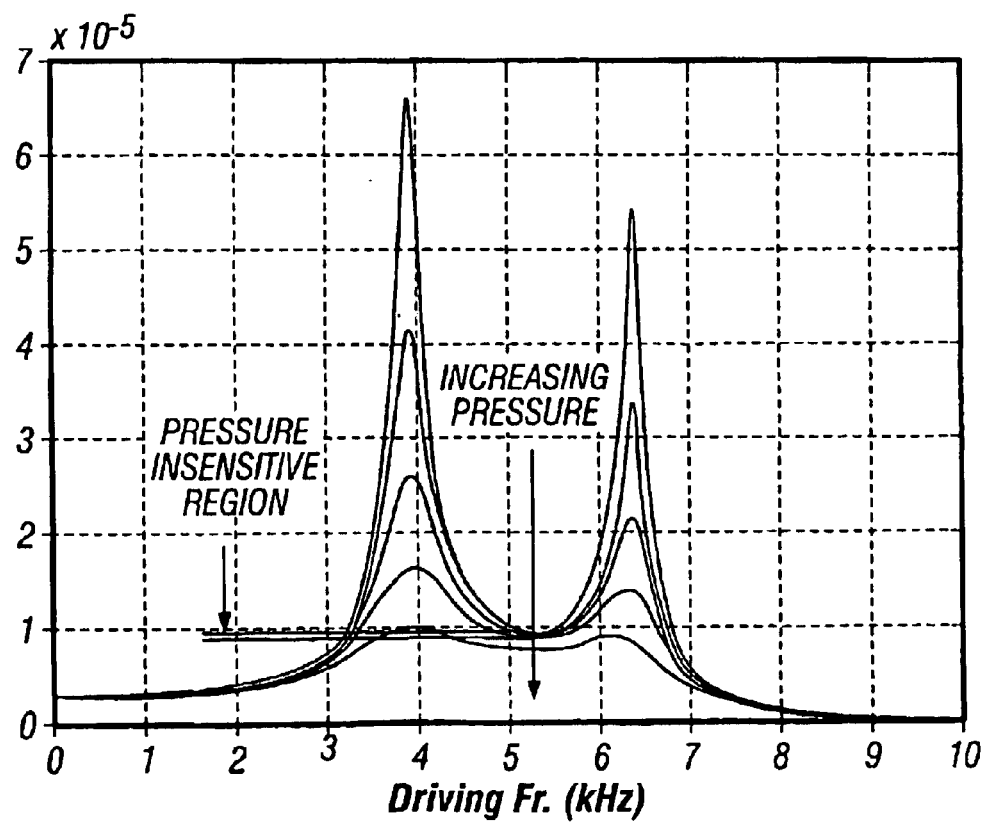
FIG. 8 is a graph of the magnitude of the passive or sense mass displacement as a function of driving frequency showing the effect of damping on drive direction response. When the damping is under a critical value, the response in the flat region is insensitive to pressure changes.
Figure 9:
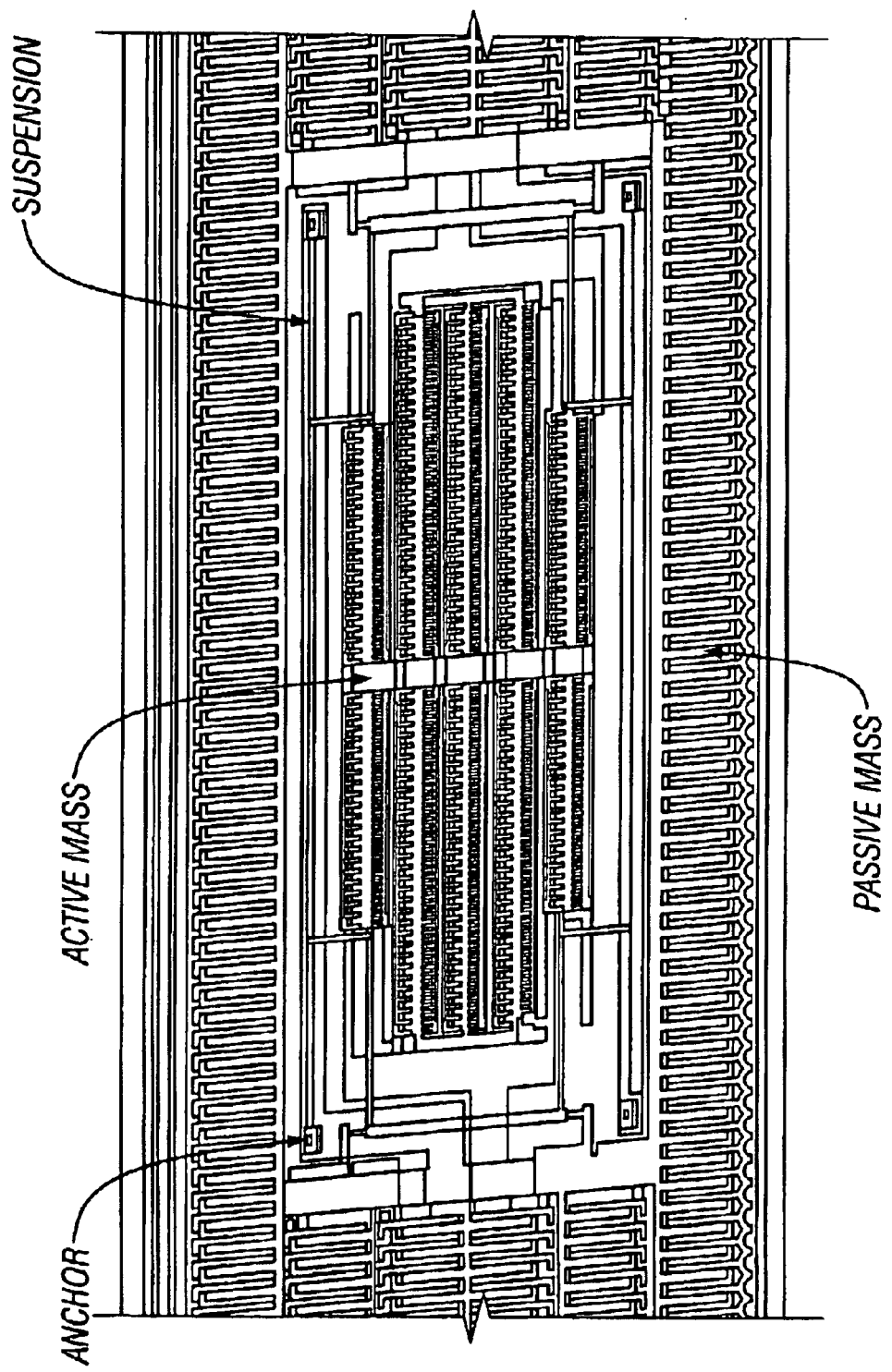
FIG. 9 is a SEM photograph of the tested prototype gyroscope.

The optimal frequency ratio $\gamma = \omega_{22}/\omega_{11}$ has to be determined such that $\gamma$ is high enough for high mechanical amplification, and high oscillation amplitudes of passive mass (FIG. 7b). From the optimal values of $\omega_{11}$ and $\mu$ the drive direction spring constant $k_{1x}$ of the active mass is obtained. Finally, the damping conditions of the overall device have to be checked to verify that damping values are in the region where the response gain in the antiresonance region is insensitive to damping variations (FIG. 8).

Experimental Verification of the Design Concept

Figure 10A:
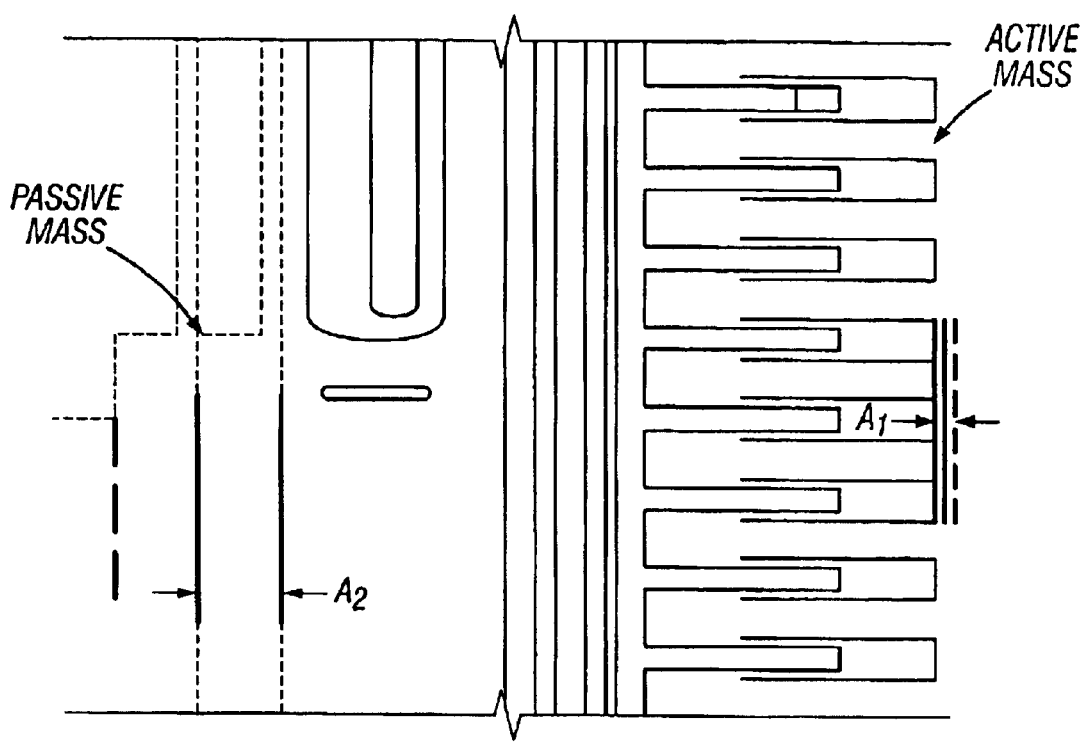
FIG. 10a is a diagram demonstrating the mechanical amplification in drive direction. The oscillation blur of the passive (slave) mass is highlighted. At the antiresonance frequency, the passive mass amplitude is over an order of magnitude larger than the active (master) mass amplitude.
Figure 10B:
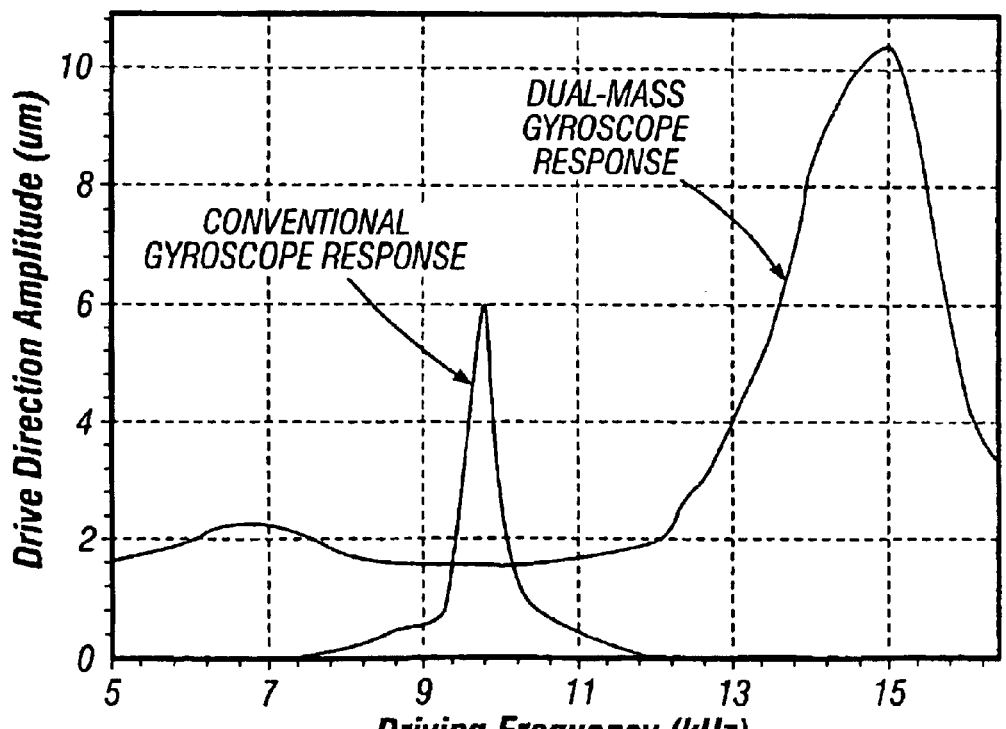
FIG. 10b is a graph of the drive direction amplitude of the sense proof mass as a function of driving frequency giving an experimental verification of the wide constant-amplitude operation frequency band that the 4-DOF system provides showing that it is more than 10 times larger than conventional gyroscopes under same operation conditions.

To assure an accurate angular rate measurement, it is crucial that the sensing element of the gyroscope is sustained in a constant amplitude oscillation in the drive direction, since the Coriolis response is directly proportional to the drive direction oscillation amplitude. Preliminary experiments conducted on prototype dual mass gyroscopes indicated a driving frequency range of over 2 kHz within where the drive direction oscillation amplitude varies by 10% (FIG. 10b). A conventional gyroscope design with similar geometry exhibited less than 200 Hz driving frequency range for 10% gain variation under same operating conditions, which is over 1.8 kHz less than dual-mass design operation range, verifying the drastically improved robustness of the dual-mass design.

The prototype gyroscopes also successfully demonstrated the mechanical amplification of "active mass" oscillation by the "passive mass", which is the sensing element of the gyroscope. The drive direction oscillation amplitude of the passive mass, which is one of the major parameters determining gyroscope performance, was demonstrated to be over 15 times larger than the active mass under atmospheric pressure (FIG. 10a). At the antiresonance frequency, the active mass drive amplitude ($A_1$ in FIG. 10a) was observed to be less than 0.1 µm, while the passive mass amplitude ($A_2$ in FIG. 10a) reached 1.4 µm.

Moreover, the proposed system offers significant advantages in self-calibration schemes and control of the drive mode oscillations. Since the maximum mechanical amplification occurs at exactly the resonant frequency of the isolated second mass-spring system, the driving frequency was extracted from a reference resonator with the same geometry and parameters as the isolated second mass-spring system built in the vicinity of the dual-mass gyroscope. With a simple Phase-Locked Loop built around the resonator stabilizing the operation frequency to the resonant frequency, the driving signal of the gyroscope is obtained from the output of the voltage-controlled oscillator of the phase-locked loop. Since all parameter variations including residual stresses or fabrication imperfections will reflect on the reference oscillator in the exact same way, the driving frequency of the gyroscope will be locked in the nominal operation band automatically at all times, without the necessity of building feedback loop around the gyroscope itself, significantly simplifying control electronics compared to the conventional designs.

Conclusion

Thus the invention is directed to a wide-bandwidth micromachined gyroscope with improved robustness was reported, along with experimental demonstration of feasibility of implementation. Specifically, it was theoretically shown and experimentally demonstrated that, by utilizing the passive disturbance-rejection capability of the oscillatory system, improved robustness is achieved against parameter variations in gyroscope dynamics. The proposed design concept was verified to provide inherent insensitivity to fabrication variations, and fluctuations in the ambient temperature or pressure during the operation time of the device; requiring less demanding control strategies for operation under presence of perturbations. Thus, the new approach is projected to relax tight fabrication tolerances, and to result in reduced production cost of micromachined gyroscopes. These advantages will allow a wide range of low-cost inertial sensing applications, where the device will be subject to high fluctuations in operation conditions.

Thus it can now be appreciated that the invention is directed to a micromachined gyroscopes with improved robustness against parameter fluctuations and expanded bandwidth are invented. The following novel features are to be noted:

1. These are the first micromachined gyroscope designs which suggest the use of two independently oscillating proof masses. The resulting dynamical system has 4 degrees of freedom.
2. The design concept utilizes the dynamical amplification idea in the 4 degrees of freedom system. This eliminates the necessity of operating the device in the resonance mode for high gain. Thus the devices are more robust against resonant frequency fluctuations.
3. The resulting 4-degrees of freedom dynamic system has a more favorable frequency response. With appropriate selection of system parameters, one can obtain a frequency response with a flat operation region between two resonant peaks. Operation of the gyroscope in this flat region results in a relatively high gain which is insensitive to parameter fluctuations.
4. The bandwidth of the devices are over 15 times as wide as the bandwidth of the existing gyroscopes. This results in drastically improved robustness against structural and thermal parameter fluctuations that effect resonant frequencies over the operating time of the device. Thus the devices can operate in a wider frequency band with insignificant change in the gain.
5. The flat operation regions of the invented gyroscopes are insensitive to damping changes. This makes the devices more robust to expected fabrication and packaging fluctuations, especially to damping variations due to ambient pressure. Consequently, tight fabrication tolerances and packaging requirements can be relaxed resulting in a lower production cost of micromachined gyroscopes.
6. The design concept provides an increased design parameter space, allowing the response of the devices to be shaped by the tuning capabilities of the devices as needed with much less compromise in performance.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed .in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for anyone of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A micromachined gyroscope comprising:
   a substrate;
   two independently oscillating interconnected proof masses, one of the two proof masses being defined as an active proof mass and the other one of the two proof masses being defined as a passive proof mass;
   a first plurality of flexures coupling the substrate to the active proof mass, and allowing the active proof mass to move in both a drive and a sense direction;
   a second plurality of flexures coupling the passive proof mass to the active proof mass, and allowing the passive proof mass to move in both the drive and sense direction;
   an oscillator to drive the active proof mass in the drive direction; and
   a sensor to detect the response of the passive proof mass in the sense direction orthogonal to the drive direction,
   whereby two resonant peaks for a sense Coriolis force are generated with a flat region therebetween and whereby the gyroscope is operated in the flat region so that the gyroscope is insensitive to parameter fluctuations.

2. The gyroscope of claim 1 where the oscillator is an electrostatic comb-drive, electrostatic parallel plate actuator, magnetic drive or alternative actuator.

3. The gyroscope of claim 1 where the sensor is at least one capacitor with movable plates, or an alternative means for sensing position.

4. The gyroscope of claim 3 where the at least one capacitor is an air gap capacitor.

5. The gyroscope of claim 1 where the active and passive proof masses are shaped and are coupled through the second plurality of flexures to comprise a linear gyroscope.

6. The gyroscope of claim 1 where the active and passive proof masses are shaped and are coupled through the second plurality of flexures to comprise a torsional gyroscope.

7. The gyroscope of claim 1 where the oscillator drives the active proof mass as a system with two degrees of freedom.

8. The gyroscope of claim 1 where the passive proof mass has a mass magnitude $m_2$ which is optimized for maximal oscillations of the passive proof mass in the sense direction.

9. The gyroscope of claim 1 where an optimal ratio $\mu = m_2/m_1$ for the masses of the active proof mass and the passive proof mass is selected to achieve insensitivity in damping, a wide bandwidth, and maintenance of gain.

10. The gyroscope of claim 1 where the active proof mass has in a corresponding isolated mass-spring system a resonant frequency $\omega_{11}$ dependent on drive spring constant $k_{1x}$ and mass $m_1$ of the active proof mass, where the passive proof mass has in a corresponding isolated mass-spring system a resonant frequency $\omega_{22}$ dependent on drive spring constant $k_{2x}$ and mass $m_2$ of the passive proof mass, and where a ratio $y = \omega_{11}/\omega_{22}$ is optimized for both high mechanical amplification and high oscillation amplitudes of the active mass.

11. The gyroscope of claim 9 where the active proof mass has in a corresponding isolated mass-spring system a resonant frequency $\omega_{11}$ dependent on drive spring constant $k_{1x}$ and mass $m_1$ of the active proof mass, where the passive proof mass has in a corresponding isolated mass-spring system a resonant frequency $\omega_{22}$ dependent on drive spring constant $k_{2x}$ and mass $m_2$ of the passive proof mass, and where a ratio $y = \omega_{11}/\omega_{22}$ is optimized for both high mechanical amplification and high oscillation amplitudes of the active mass.

12. The gyroscope of claim 11 where the drive direction spring constant $k_{1x}$ of the plurality of flexures for the active mass are determined according to an optimal resonant frequency $\omega_{11}$ and an optimal mass ratio $\mu$.

13. The gyroscope of claim 1 further comprising a feedback sensor for sensing motion of the passive proof mass, a circuit coupled to the feedback sensor to generate an error signal relative to a reference signal, and a controller to control the oscillator to drive the active proof mass toward a zero error signal for closed loop control.

14. A method of operating a micromachined gyroscope comprised of the steps of:
   providing two interconnected proof masses, one of the two proof masses being defined as an active proof mass and the other one of the two proof masses being defined as a passive proof mass, a plurality of flexures coupling a substrate to the active proof mass, and allowing the active proof mass to move in both a drive and a sense direction, a plurality of flexures coupling the passive proof mass to the active proof mass, and allowing the passive proof mass to move in both the drive and sense direction;
   oscillating the active proof mass in the drive direction; and
   independently oscillating the passive proof mass by means of an interconnection with the active proof mass; and
   sensing the response of the passive proof mass in the sense direction orthogonal to the drive direction,
   whereby two resonant peaks for a sense Coriolis force are generated with a flat region therebetween and whereby the gyroscope is operated in the flat region so that the gyroscope is insensitive to parameter fluctuations.

15. The method of claim 14 where oscillating the active proof mass in the drive direction comprises driving the active proof mass with an electrostatic comb or magnetic drive.

16. The method of claim 14 where sensing the response of the passive proof mass in the sense direction orthogonal to the drive direction comprises sensing the change in capacitance of at least one capacitor with movable plates.

17. The method of claim 16 where sensing the change in capacitance of at least one capacitor senses the change of capacitance in an air gap capacitor.

18. The method of claim 14 where providing the active and passive proof masses comprises shaping the active and passive proof masses and coupling the active and passive proof masses through respective flexures to comprise a linear gyroscope.

19. The method of claim 14 where providing the active and passive proof masses comprises shaping the active and passive proof masses and coupling them through their respective flexures to comprise a torsional gyroscope.

20. The method of claim 14 where oscillating the active proof mass in the drive direction drives the active proof mass as a system with two degrees of freedom.

21. The method of claim 14 where the passive proof mass has a mass magnitude $m_2$ and further comprises optimizing the passive proof mass has a mass magnitude $m_2$ for maximal oscillations of the passive proof mass in the sense direction.

22. The method of claim 14 further comprising optimizing a ratio $\mu = m_2/m_1$ for the masses of the active proof mass and the passive proof mass to achieve insensitivity in damping, a wide bandwidth, and maintenance of gain.

23. The method of claim 14 where the active proof mass has in a corresponding isolated mass-spring system a resonant frequency $\omega_{11}$ dependent on drive spring constant $k_{1x}$ and mass $m_1$ of the active proof mass, where the passive proof mass has in a corresponding isolated mass-spring system a resonant frequency $\omega_{22}$ dependent on drive spring constant $k_{2x}$ and mass $m_2$ of the passive proof mass, and further comprising optimizing a ratio $y = \omega_{11}/\omega_{22}$ for both high mechanical amplification and high oscillation amplitudes of the active mass.

24. The method of claim 22 where the active proof mass has in a corresponding isolated mass-spring system a resonant frequency $\omega_{11}$ dependent on drive spring constant $k_{1x}$ and mass $m_1$ of the active proof mass, where the passive proof mass has in a corresponding isolated mass-spring system a resonant frequency $\omega_{22}$ dependent on drive spring constant $k_{2x}$ and mass $m_2$ of the passive proof mass, and further comprising optimizing a ratio $y = \omega_{11}/\omega_{22}$ for both high mechanical amplification and high oscillation amplitudes of the active mass.

25. The method of claim 24 further comprising determining a drive direction spring constant $k_{1x}$ of the plurality of flexures for the active mass according to an optimal resonant frequency $\omega_{11}$ and an optimal mass ratio $\mu$.

26. The method of claim 14 further comprising sensing motion of the passive proof mass, generating an error signal relative to a reference signal, and controlling the drive of the active proof mass toward a zero error signal for closed loop control.

* * * * *